(12) United States Patent
Kota et al.

(10) Patent No.: US 6,175,170 B1
(45) Date of Patent: Jan. 16, 2001

(54) COMPLIANT DISPLACEMENT-MULTIPLYING APPARATUS FOR MICROELECTROMECHANICAL SYSTEMS

(76) Inventors: Sridhar Kota, 9391 Quail Ridge Run, Brighton, MI (US) 48114; M. Steven Rodgers, 12216 Papaya Ct., NE., Albuquerque, NM (US) 87111; Joel A. Hetrick, 818 S. Gammon, Apartment 4, Madison, WI (US) 53719

( * ) Notice: Under 35 U.S.C. 154(b), the term of this patent shall be extended for 0 days.

(21) Appl. No.: 09/393,396

(22) Filed: Sep. 10, 1999

(51) Int. Cl.$^7$ ................................................ H02K 33/10
(52) U.S. Cl. .................................. 310/40 MM; 310/307
(58) Field of Search ........................... 310/40 MM, 309, 310/307; 257/415; 216/2; 74/479.01

(56) References Cited

U.S. PATENT DOCUMENTS

| | | | |
|---|---|---|---|
| 4,891,255 | * 1/1990 | Ciarlo | 428/131 |
| 4,969,259 | * 11/1990 | Mikkor | 73/514.36 |
| 4,973,145 | 11/1990 | Kirkwood | 359/812 |
| 5,122,852 | * 6/1992 | Chang et al. | 257/184 |
| 5,381,231 | * 1/1995 | Tu | 356/352 |
| 5,491,604 | * 2/1996 | Ngueyn et al. | 361/278 |
| 5,563,343 | * 10/1996 | Shaw et al. | 73/514.18 |
| 5,631,514 | 5/1997 | Garcia | 310/309 |
| 5,649,454 | 7/1997 | Midha | 74/520 |
| 5,786,621 | * 7/1998 | Saif et al. | 257/415 |
| 5,804,084 | 9/1998 | Nasby | 216/2 |
| 5,806,152 | 9/1998 | Saitou | 24/662 |

FOREIGN PATENT DOCUMENTS 0 067 095 A2 * 12/1982 (EP) .

OTHER PUBLICATIONS

S.B. Tuttle, *Mechanisms for Engineering Design*, Chapter 8: Semifixed Flexural Mechanisms, pp. 144–160 (John Wiley & Sons, Inc., New York, 1967).

L. Saggere, S. Kota and S.B. Crary, "A New Design for Suspension of Linear Microactuators," *Dynamic Systems and Control: vol. 2*, DSC–vol. 55–2, pp. 671–675 (ASME, 1994).

G.K. Ananthasuresh, S. Kota and N. Kikuchi, "Strategies for Systematic Synthesis of Compliant MEMS," *Dynamic Systems and Control: vol. 2*, DSC–vol. 55–2, pp. 677–6686 (ASME, 1994).

G.K. Anathasuresh, S. Kota and Y. Gianchandani, "A Methodical Approach to the Design of Compliant Micromechanisms," *Proceedings of the Solid–State Sensor and Actuator Workshop*, Hilton Head, SC, Jun. 13–16, 1994, pp. 189–192.

(List continued on next page.)

*Primary Examiner*—Nestor Ramirez
*Assistant Examiner*—Joseph Waks
(74) *Attorney, Agent, or Firm*—John P. Hohimer

(57) ABSTRACT

A pivotless compliant structure is disclosed that can be used to increase the geometric advantage or mechanical advantage of a microelectromechanical (MEM) actuator such as an electrostatic comb actuator, a capacitive-plate electrostatic actuator, or a thermal actuator. The compliant structure, based on a combination of interconnected flexible beams and cross-beams formed of one or more layers of polysilicon or silicon nitride, can provide a geometric advantage of from about 5:1 to about 60:1 to multiply a 0.25–3 $\mu$m displacement provided by a short-stroke actuator so that such an actuator can be used to generate a displacement stroke of about 10–34 $\mu$m to operate a ratchet-driven MEM device or a microengine. The compliant structure has less play than conventional displacement-multiplying devices based on lever arms and pivoting joints, and is expected to be more reliable than such devices. The compliant structure and an associated electrostatic or thermal actuator can be formed on a common substrate (e.g. silicon) using surface micromachining.

29 Claims, 15 Drawing Sheets

OTHER PUBLICATIONS

G.K. Anathasuresh and S. Kota, "Designing Compliant Mechanisms," *Mechanical Engineering*, pp. 93–96, Nov. 1995.

G.K. Anathasuresh and S. Kota, "The Role of Compliance in the Design of MEMS," *Proceedings of the 1996 ASME Design Engineering Technical Conferences and Computers in Engineering Conference,* Aug. 18–22, Irvine, CA, pp. 1–3.

M.I. Frecker, G.K. Anathasuresh, S. Nishiwake, N. Kikuchi and S. Kota, "Topoligical Synthesis of Compliant Mechanisms Using Multi–Criteria Optimization," *Transactions of the ASME*, vol .119, pp. 238–245, Jun. 1997.

J.A. Hetrick and S. Kota, "Size and Shape Optimization of Compliant Mechanisms: An Efficiency Formulation," in Proceedings of the 1998 ASME Design Technical Conference, Sep. 13–16, 1998, Atlanta, GA.

* cited by examiner

"Prior Art"

US 6,175,170 B1

COMPLIANT DISPLACEMENT-MULTIPLYING APPARATUS FOR MICROELECTROMECHANICAL SYSTEMS

This invention was made with Government support under Contract No. DE-AC04-94AL85000 awarded by the U.S. Department of Energy. The Government has certain rights in the invention.

FIELD OF THE INVENTION

The present invention relates to the field of microelectromechanical (MEM) systems, and in particular to a pivotless compliant structure formed by surface micromachining processes for use in combination with a MEM actuator such as an electrostatic comb actuator, a capacitive-plate electrostatic actuator or a thermal actuator to multiply a displacement or force provided by the MEM actuator.

BACKGROUND OF THE INVENTION

In the formation of many types of microelectromechanical (MEM) devices, a motive source is required such as an electrostatic or thermal actuator. Previous electrostatic comb actuators have generally consumed a large fraction of the size of a die on which the MEM device is formed (e.g. up to ⅔ of the die size). Additionally, the die size is constrained by available steppers used for photolithographic processes during the MEM fabrication process. As a result, the size and complexity of MEM devices which can be formed is presently constrained by the size of the motive source used.

Reducing the size of the motive source can alleviate this problem and leave more space on the die for MEM devices of increased complexity and functionality. However, smaller-size electrostatic comb actuators produce a correspondingly smaller range of displacement (i.e. a smaller actuation stroke) which can be, for example, about 5 microns or less. Thermal actuators and capacitive-plate electrostatic actuators generally provide a much larger force than is available with electrostatic comb actuators. However, this larger force is generated over a short actuation stroke of typically 0.25–2 μm which is insufficient for driving many types of MEM devices such as ratchet-driven gears, stages or racks; or microengines such as that disclosed in U.S. Pat. No. 5,631,514 to Garcia et al. Therefore, what is needed is a mechanism for multiplying the range of displacement from a short-stroke actuator to provide an increased range of displacement that is sufficient for actuating a particular MEM device. This will allow the use of compact electrostatic comb actuators, or alternately capacitive-plate or thermal actuators, thereby allowing the formation of MEM devices of increased complexity and functionality within a given die size.

Prior displacement-multiplying devices have been based on a lever arm moving about a pivot joint as shown in FIG. 1. However, the use of a pivoted displacement-multiplying device is undesirable due to the play in the pivot joint which is limited by fabrication tolerances, and which can be substantial compared to the range of displacement of a short-stroke actuator. For example, a thermal actuator can provide a range of displacement that is only 0.25 μm for heating from room temperature up to about 400 °0C. This is comparable to the play in MEM pivot joints so that the use of a displacement-multiplying device having a pivot joint would not be suitable for use in increasing the range of displacement of a thermal actuator.

Another disadvantage of a displacement-multiplying devices based on a lever arm moving about a pivot joint is that the motion of each end of the lever arm is arcuate rather than linear. Furthermore, an output displacement of the lever arm displacement-multiplying device is not directed along the same line as an input displacement provided by the actuator. This can complicate the design of MEM devices employing a lever arm displacement-multiplying device.

Midha et al in U.S. Pat. No. 5,649,454 disclose a compliant constant-force mechanism that is capable of producing a substantially constant output force in response to a linear input displacement. The mechanism of Midha et al is based on a four-bar slider mechanism which includes one or more pivot joints (i.e. revolute joints which permit interconnected members to pivot without generating a torsional moment). As mentioned above, such pivot joints are undesirable for multiplying the displacement range of an actuator in a MEM device since the pivot joints can result in excessive play due to fabrication tolerances.

The present invention overcomes the limitations of the prior art by providing a pivotless compliant structure that can be used in combination with a MEM actuator to form a MEM apparatus having a different output displacement and force from that provided by the actuator.

An advantage of the present invention is that play due to fabrication tolerances is substantially reduced compared with pivoting mechanisms.

Yet another advantage of the present invention is that a linear displacement from a MEM actuator can be provided as an input to the pivotless compliant mechanism to generate a different displacement range that is also linear (i.e. along a straight line).

A further advantage of the present invention is that the pivotless compliant structure can be designed to respond to an input force and displacement and generate therefrom an output force and displacement that is directed either substantially in-line with the input force and displacement or at an arbitrary angle with respect to input force and displacement.

Another advantage of the present invention is that the pivotless compliant structure can be designed to operate with a MEM actuator providing a range of displacement of less than or equal to 5 microns and generate therefrom an output displacement that is multiplied by a factor in the range of 5 to 60 (with a correspondingly reduced output force). This can allow, for example, the use of compact short-stroke electrostatic or thermal actuators to generate a range of displacement suitable for use in driving MEM ratcheting devices, or microengines.

Yet another advantage of the present invention is that the pivotless compliant structure can be used in a reverse sense to multiply the force provided by a MEM actuator with a corresponding reduction in the range of displacement available from the compliant structure. This can allow, for example, the use of long-stroke electrostatic comb actuators to provide an increased force over that which could otherwise be generated.

Still another advantage of the present invention is that the pivotless compliant structure can be fabricated of polycrystalline silicon or silicon nitride for compatibility with surface micromachining processes.

These and other advantages of the present invention will become evident to those skilled in the art.

SUMMARY OF THE INVENTION

The present invention relates to a pivotless compliant structure formed on a substrate for receiving an input displacement at one end thereof from a motive source, and generating a multiplied displacement therefrom for provision to a load. The pivotless compliant structure comprises a plurality of flexible beams attached at one end thereof to the substrate, with the other end of each flexible beam being moveable; an input beam connected between the motive source and a first flexible beam; an output beam connected between the load and a second flexible beam; and a plurality of cross-beams interconnecting the first flexible beam to the second flexible beam, with each cross-beam further being connected between the moveable ends of an adjacent pair of the plurality of flexible beams. In some preferred embodiments of the present invention, a pair of pivotless compliant structures as described above are arranged in mirror symmetry about a common axis to provide motion substantially along the axis while minimizing any motion perpendicular to the axis. The pivotless compliant structure can be formed using surface micromachining processes, with the structure preferably being formed from polycrystalline silicon, or alternately from silicon nitride. The pivotless compliant structure can be used in combination with a motive source formed on the same substrate (e.g. a silicon substrate), with the motive source comprising a MEM actuator such as an electrostatic comb actuator, a capacitive-plate electrostatic actuator, or a thermal actuator.

The present invention further relates to a MEM apparatus which comprises a MEM actuator providing movement over a first linear displacement range and further providing a first force of actuation; and a pivotless compliant structure operatively connected to the MEM actuator for receiving the movement over the first linear displacement range and the first force of actuation and generating therefrom a second linear displacement range which is different from the first linear displacement range, and a second force of actuation which is different from the first force of actuation. The pivotless compliant structure in this embodiment of the present invention preferably comprises a plurality of flexible beams, with each flexible beam having a stationary end and a moveable end; an input beam connected between the MEM actuator and the moveable end of a first beam of the plurality of flexible beams; an output beam connected at one end thereof to the moveable end of a second beam of the plurality of flexible beams; and a plurality of cross-beams arranged to interconnect the moveable ends of each of the plurality of flexible beams, thereby operatively connecting the input beam to the output beam. Each cross-beam is generally oriented at an angle of less than 90° (i.e. an acute angle) with respect to the flexible beams to which that cross-beam is connected.

According to various embodiments of the present invention, input beam and the output beam can either move substantially in-phase with respect to each other or substantially out-of-phase with respect to each other for operation below resonance. Furthermore, the second force of actuation can be directed either substantially in-line with the first force of actuation or at an arbitrary angle with respect to the first force of actuation. Finally, the second linear displacement range can be either greater than the first linear displacement range (e.g. a multiplication factor of 5–60 when the first linear displacement range is 5 µm or less), with the second force of actuation being correspondingly smaller than the first force of actuation; or alternately, the second linear displacement range can be less than the first linear displacement range (e.g. about one-fifth to one-sixtieth of the first linear displacement range), with the second force of actuation being correspondingly greater than the first force of actuation (e.g. by a factor of 5–60).

According to the present invention, the stationary end of each flexible beam is attached to a substrate (e.g. silicon) whereon the pivotless compliant structure and the MEM actuator (generally an electrostatic comb actuator, a capacitive-plate electrostatic actuator or a thermal actuator) are formed. The flexible beams can comprise, for example, polycrystalline silicon or silicon nitride in one or more deposited and patterned layers.

The present invention also relates to a MEM apparatus, comprising a substrate (e.g. a silicon substrate); a MEM actuator formed on the substrate; and a pivotless compliant structure formed on the substrate proximate to the MEM actuator and operatively connected thereto for multiplying a range of displacement provided by the MEM actuator. The MEM actuator can be an electrostatic comb actuator, a capacitive-plate electrostatic actuator, or a thermal actuator. The pivotless compliant structure preferably further comprises a plurality of flexible beams, with each flexible beam having a stationary end attached to the substrate and a moveable end; and a plurality of cross-beams, with each cross-beam interconnecting the moveable ends of an adjacent pair of the plurality of flexible beams. Each cross-beam is preferably oriented at an angle of less than 90° (i.e. an acute angle) with respect to each flexible beam to which the cross-beam is connected, with the flexible beams and the cross-beams being formed from either polycrystalline silicon or silicon nitride.

The present invention is particularly useful for use with short-stroke MEM actuators having a relatively small range of displacement of the moveable output arm of typically less than or equal to 5 microns. When used in combination with such short-stroke MEM actuators, the pivotless compliant structure can be designed to multiply the range of displacement provided by the moveable output arm of the MEM actuator by a factor that is generally in the range of five to sixty. The present invention has applications for forming many different types of MEM devices, including ratcheting devices and microengines.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
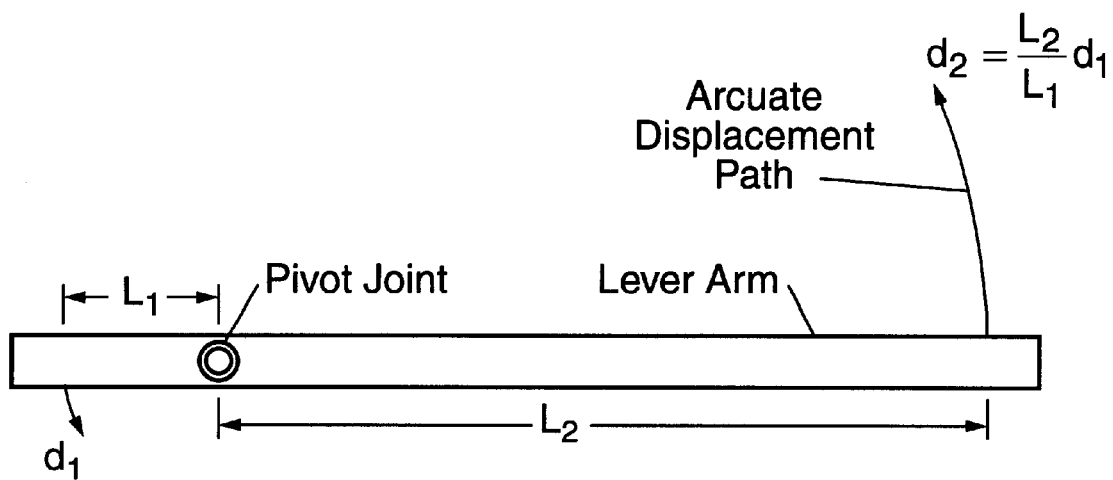
FIG. 1 shows schematically a prior-art displacement-multiplying device based on a lever arm that is moveable about a pivot joint to produce an arcuate displacement path.
Figure 2:
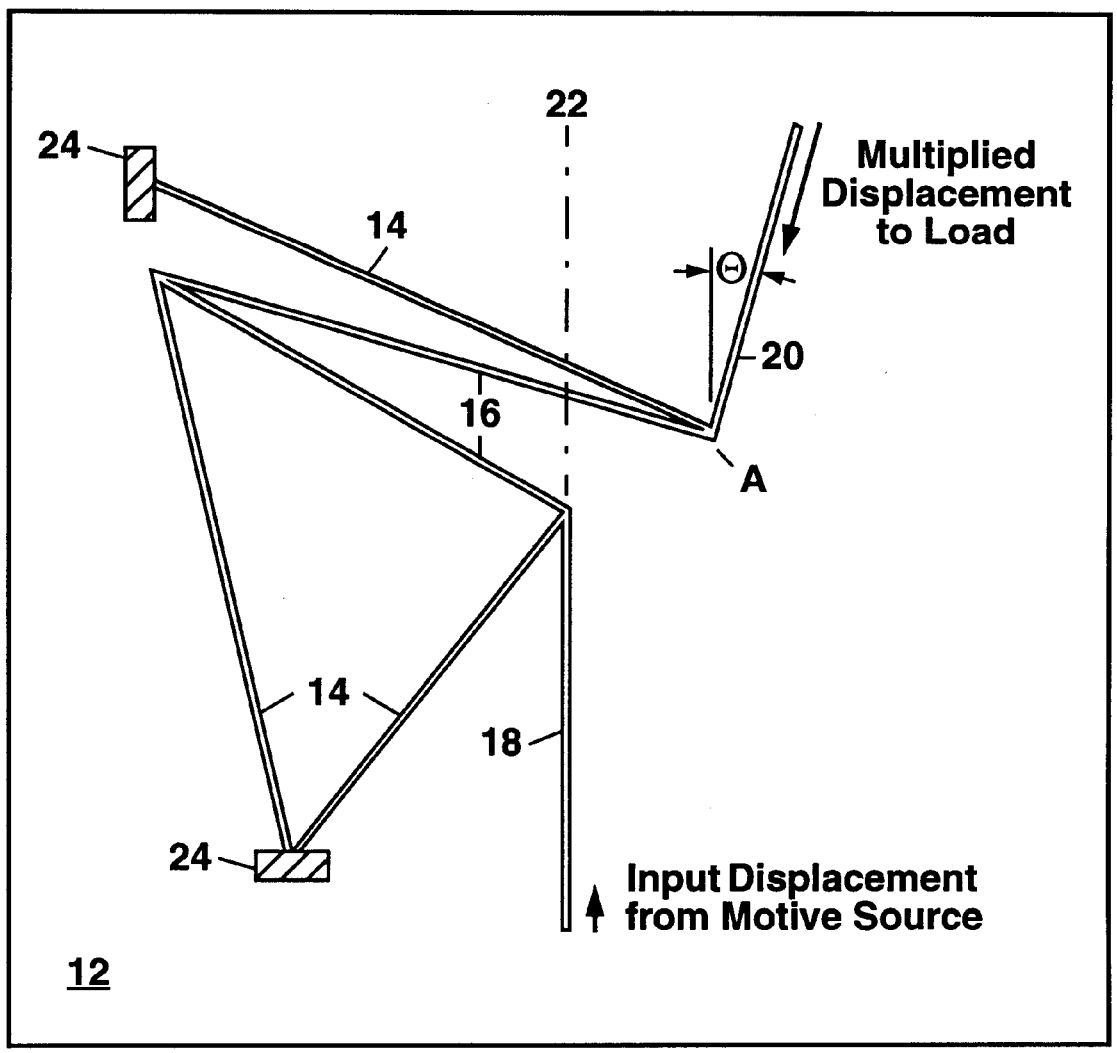
FIG. 2 shows schematically a plan view of a first example of a pivotless compliant structure formed on a substrate according to the present invention.

Referring to FIG. 2, there is shown schematically a plan view of a first example of the present invention in the form of a pivotless compliant structure 10 formed on a substrate 12 by surface micromachining processes. A "compliant structure" is defined herein as a structure that exploits elastic deformation to achieve a force/displacement transformation, with the displacement being changed (e.g. increased) relative to an input displacement provided to one end of the compliant structure, and with an output force being correspondingly changed in the opposite sense (e.g. decreased) relative to an input force provided to the same end of the compliant structure. In one direction of operation, an output displacement is increased relative to an input displacement; and an output force is correspondingly decreased relative to an input force. In the other direction of operation, the opposite effect occurs with the output force being increased relative to the input force; and with the output displacement being decreased relative to the input displacement. For an ideal lossless compliant structure, the output force times the output displacement is equal to the input force times the input displacement. For actual compliant structures, however, some losses occur so that the output force times the output displacement is generally equal to about 70–90% of the input force times the input displacement. For applications requiring relatively small displacements and rotations, a complaint structure 10 as shown in FIG. 2 is advantageous over conventional rigid pivoting structures in being more efficient in conserving energy and space.

In FIG. 2, the pivotless compliant structure 10 comprises a predetermined arrangement of a plurality of interconnected flexible beams 14, and cross-beams 16 formed of one or more layers of deposited and patterned polycrystalline silicon (also termed polysilicon), or alternately silicon nitride to provide a predetermined geometric advantage and a predetermined mechanical advantage. The geometric advantage is defined herein as the ratio of an output displacement generated by the pivotless compliant structure 10 in response to an input displacement provided thereto. The mechanical advantage is defined herein as the ratio of an output force generated by the pivotless compliant structure 10 in response to an input force provided thereto. It should be noted that the geometric advantage and the mechanical advantage of a compliant mechanism can change slightly depending on the boundary conditions applied to the compliant mechanism.

For an ideal lossless operation of the pivotless compliant structure 10 of FIG. 2, the geometric advantage is 12:1; and the mechanical advantage is 1:12. If the pivotless compliant structure 10 were to be operated in a reverse sense (i.e. with an input force and displacement provided at beam 20 and an output force and displacement generated at beam 18), then ideally the geometric advantage would be 1:12, and the mechanical advantage would be 12:1.

For microelectromechanical (MEM) applications, the entire compliant structure 10 is preferably formed on a silicon substrate 12, with the structure 10 having lateral dimensions on the order of a few millimeters or less (e.g. 212 $\mu$m wide×240 $\mu$m high), and with a thickness on the order of 10 $\mu$m or less. The width of the individual flexible beams 14 and cross-beams 16 can range from about 1 $\mu$m to about 10 $\mu$m, and preferably about 1–2 $\mu$m wide. Compliance of the structure 10 is preferably distributed throughout the entire structure 10, thereby forming a flexible mechanism.

The compliant structure 10 in FIG. 2 can further include an input beam 18 for coupling an input displacement (with a direction and magnitude indicated by the small arrow in FIG. 2) from a motive source (i.e. a MEM actuator) to the structure 10, and an output beam 20 for conveying a multiplied displacement (with a direction and magnitude indicated by the large arrow in FIG. 2) from the structure 10 to a load (e.g. a moveable element such as a gear, stage or rack that is to be driven by the compliant structure 10 acting in combination with the motive source). The input displacement in the example of FIG. 2 is directed along an axis 22; and the multiplied displacement can be directed at any predetermined angle, $\Theta$, with respect to the axis 22. The terms "displacement" and "displacement range" are used herein interchangeably to indicate a range of motion of a moveable member (e.g. an input beam 18 and/or an output beam 20) of the compliant structure 10.

Each flexible beam 14 comprises a stationary end which is attached directly or indirectly to the substrate 12 so that the stationary end remains motionless during operation of the compliant structure 10. This can be done, for example, using a support post 24 (e.g. comprising polycrystalline silicon or silicon nitride) extending upward from an upper surface of the substrate 12, with the stationary end of each flexible beam 14 being formed on or attached to the support post 24. In this way, each flexible beam 14 can be suspended above the surface of the substrate 12 so that each beam 14 can flex in response to a force applied to the other end (i.e. a moveable end) of each beam 14. The compliance of each flexible beam 14 can further be controlled along the length of the beam 14 by varying the width and/or the thickness of the beam 14. For example, to provide an increased flexibility for a particular beam 14, that beam 14 can be necked down over a predetermined length of the beam 14 near the support post 24, while the remainder of that beam 14 is sufficiently stiff to withstand both an actuation force applied to it from the motive source and a resistive force applied to it by the load.

The compliance of the flexible beam 14 causes it to act similar to a leaf spring, bending in response to an applied force and returning to its original unflexed position once that force is removed. Such flexing motion stores elastic energy which can be reused for efficient operation of the device 10. Additionally, the flexing action of the flexible beams 14 eliminates the need for stroke return springs, which are generally required in pivoting mechanisms. Furthermore, the compliant structure 10 of the present invention is advantageous in minimizing friction, wear and backlash which are all commonly found in pivoting mechanisms. Finally, the compliant structure 10 of the present invention can be formed by surface micromachining processes so that no piece-part assembly is required.

In the example of FIG. 2, the input beam 18 is connected between the motive source (not shown) and a first flexible beam 14; and the load (not shown) is connected to a second flexible beam 14 via the output beam 20. A plurality of cross-beams 16 are then used to interconnect the first and second flexible beams 14, with each cross-beam 16 further being connected between the moveable ends of an adjacent pair of the plurality of flexible beams 14. In some preferred embodiments of the present invention, a pair of pivotless compliant structures 10 are arranged in mirror symmetry about the axis 22 to provide motion substantially along the axis 22 while preferably minimizing any motion perpendicular to the axis 22 (see FIG. 6).

In designing a compliant structure 10 such as that shown in the example of FIG. 2 to respond to particular input forces and displacements and to generate therefrom predetermined output forces and displacements, a topology optimization computer program can be used to determine an ideal structural form, including the topology of the structure 10, and its size and shape. In order to quantify a specific size and shape for the compliant structure 10, the optimization program can address the following design criteria: (1) the required kinematic motion (both the magnitude and direction); (2) the desired mechanical advantage or geometric advantage; (3) the required stiffness to an external load; (4) material properties of the compliant structure 10; (5) stress limitations of the compliant structure 10; (6) buckling instabilities of the compliant structure 10; and (7) weight and size limitations, if any, for the compliant structure 10. Minimizing the size (e.g. a minimum feature size and lateral dimensions) of the compliant structure 10 is particularly important for MEM devices.

In general, the design of a compliant mechanism such as the structure 10 of FIG. 2 is driven by the relationship between the input and output forces and deflections. A multi-criteria optimization-based numerical method (i.e. a computer program) can then be used for the topological synthesis of the compliant structure 10, taking into account both the kinematic (i.e. motion) requirements and the structural (i.e. loading) requirements of the structure 10 while maximizing the mechanical efficiency of the compliant structure 10. An advantage of such an approach is that precise control over the mechanical advantage and the geometric advantage of the compliant structure 10 can be enforced during the optimization process to obtain a quantitative determination of an optimized design for the compliant structure 10. The resulting optimized structure 10 will then exhibit an improved mechanical efficiency while having the desired kinematic properties.

The mechanical efficiency, $\eta_{efficiency}$, of a compliant structure 10 formed according to the present invention is given by:

$$\eta_{efficiency} = \frac{-F_{ex} \cdot u_{out_2}}{\frac{1}{2}(F_{in_1} \cdot u_{in} + F_{in_2} \cdot u_{in})}$$

where $u_{in}$ represents an input displacement applied to the structure 10 at input beam 18; $F_{in_1}$, represents an initial (i.e. unactuated) input reaction force necessary to hold the input beam 18 in a fixed or unactuated position during loading by an external load, $F_{ex}$, applied at the output beam 20; $F_{in_2}$ represents a final (i.e. actuated) input force applied to the input beam 18 to produce the input displacement $u_{in}$; and $u_{out_2}$ represents the displacement of the output beam 20 produced by the final input force, $F_{in_2}$. From this equation, those skilled in the art will recognize that to increase the mechanical efficiency, $\eta_{efficiency}$, of the compliant structure 10, the input energy, given by the denominator of the above equation, should be minimized and the output energy, given by the numerator of the above equation, should be maximized. Minimizing the input energy amounts to reducing $F_{in_1}$ and $F_{in_2}$ which lowers the strain energy absorbed by the compliant structure 10 and also lowers an amount of work that is available to displace a load connected to the output beam 20.

In order to optimize the size and shape of the compliant structure 10, a topology must initially be determined that can satisfy the required force and displacement requirements for the structure 10. This can be done using a topology optimization computer program which models arrays of interconnected beams (e.g. as in FIG. 2) while adjusting a cross-section shape of the beams and an overall geometry of the interconnected beams. The size and shape of the compliant structure 10 can then be optimized by maximizing the mechanical efficiency, $\eta_{efficiency}$, to determine an optimum cross-section size and orientation of each beam in the structure 10 subject to the following constraints: (1) a desired mechanical advantage, $MA_{desired}$, given by:

$$\frac{F_{ex}}{F_{in_1}} = MA_{desired}$$

or a desired geometric advantage, $GA_{desired}$, given by:

$$\frac{u_{out_2}}{u_{in}} = GA_{desired}$$

(2) if necessary, a constraint given by:

$$U_{out_2} \cdot U_{perp} = 0$$

can be imposed to restrict the kinematic motion of the compliant structure 10 by forcing the output displacement vector, $u_{out2}$, to become perpendicular to a unit vector, $u_{perp}$, where $u_{perp}$ is perpendicular to a desired direction of displacement of the output beam 20; (3) a loading constraint given by:

$$F_{ex} < F_{crit}$$

can be imposed during the optimization process to prevent the possibility of buckling of the structure 10 at a critical value of force, $F_{crit}$, at the output beam 20 due to resistance of the load; (4) a stress constraint given by:

$$\sigma_i \leq \sigma_{max}$$

can be imposed to limit an internal stress, $\sigma_i$, of the structure 10 to be less than or equal to a maximum value of stress, $\sigma_{max}$; and (5) a volume constraint given by:

$$\int_{Volume} \leq Resource_{max}$$

can be imposed to limit an overall volume, $\int_{Volume}$, of the structure 10 to a predetermined resource maximum, $Resource_{max}$, (i.e. a maximum volume or die space to be allotted to the compliant structure 10). For MEM devices, the vertical dimension is generally small (e.g. $\leq 10$ $\mu$m) so that the above volume constraint can generally be replaced by an area constraint which restricts the area to be less than the $Resource_{max}$. Additionally, material parameters (e.g. for polysilicon or silicon nitride) are provided as an input to the optimization program. The optimization program then optimizes the size and shape of the compliant structure 10 to improve its mechanical efficiency while satisfying all relevant design constraints as outlined above.

Once a design for the pivotless compliant structure 10 has been selected and sized, the structure 10 can be formed on a silicon substrate 12 using conventional surface micromachining processes as known to the art. These surface micromachining processes, which are the basis for forming many different types of MEM devices, are based on repeated steps for depositing and photolithographically patterning a plurality of alternating layers of polycrystalline silicon (also termed polysilicon) or silicon nitride, and a sacrificial material (e.g. silicon dioxide or a silicate glass) to build up the compliant structure 10 of FIG. 2 layer by layer.

FIGS. 3a–3j schematically illustrate the formation of one of the compliant beams 14 and support post 24 of the example of the compliant structure 10 of FIG. 2 upon a silicon substrate 12 by surface micromachining. FIGS. 3a–3j are shown as cross-section views (not to scale) taken through a compliant beam 14 and its support post 24. Although not shown in FIGS. 3a–3j, all the remaining beams forming the compliant structure 10 in FIG. 2 and in the other examples of the present invention disclosed herein are similarly formed and differ only in length and width and orientation of the beams on the substrate 12. Additionally, the surface micromachining steps described with reference to FIGS. 3a–3j can also be used to form one or more electrostatic or thermal actuators on the substrate 12. Finally, the method for forming the compliant structure 10 and associated MEM actuator will be described as a molding process wherein a plurality of layers of sacrificial material are patterned for subsequent deposition of polysilicon or silicon nitride. Those skilled in the art will know that alternative methods can be used to form the compliant structure 10 and MEM actuator by surface micromachining. In some preferred embodiments of the present invention, the molding process described hereinafter can be combined with patterning of the deposited polysilicon or silicon nitride so that a single etching step need be used to pattern each layer of sacrificial material, with a subsequent etch step then being used to pattern the deposited polysilicon or silicon nitride overlying the mold formed by the layer of sacrificial material.

The surface micromachining process steps described hereinafter are based on conventional integrated circuit (IC) processing and can include a number of different and repeated steps including material deposition, photolithography, masking, etching, mask stripping, and cleaning. Therefore, only a few of the relevant process steps will be described in detail; and those skilled in the art will understand other process steps not specifically mentioned herein. Furthermore, it will be understood by those skilled in the art that the term "patterning" as used herein refers to a sequence of well-known semiconductor integrated circuit processing steps including applying a photoresist to the substrate 12, prebaking the photoresist, aligning the substrate 12 with a photomask, exposing the photoresist through the photomask, developing the photoresist, baking the photoresist, etching away the surfaces not protected by the photoresist, and stripping the protected areas of the photoresist so that further processing can take place. The term "patterning" can further include the formation of a hard mask (e.g. comprising about 500 nanometers of a silicate glass deposited from the decomposition of tetraethylortho silicate, also termed TEOS, by low-pressure chemical vapor deposition at about 750° C. and densified by a high temperature processing) overlying a polysilicon or sacrificial material layer in preparation for defining features into that layer by anisotropic dry etching (e.g. reactive ion etching).

Figure 3A:
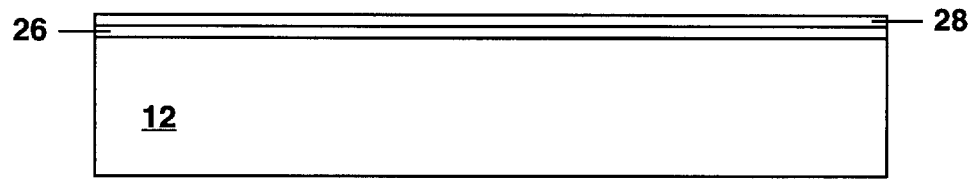
FIGS. 3a–3j illustrate in cross-section views a series of surface micromachining process steps which can be used to form the compliant structure of FIG. 2.

In FIG. 3a, a substrate 12 is provided which preferably comprises silicon. The substrate 12 can be initially prepared for fabrication of the compliant structure 10 and any other MEM devices (e.g. one or more MEM actuators, and a load such as a driven gear, a gear train, a moveable stage, rack or other mechanism to be actuated by operation of the compliant structure 10 acting in combination with the MEM actuator) by blanketing the substrate 12 with a layer of thermal oxide 26 (e.g. about 600 nanometers thick) formed by a conventional wet oxidation process at an elevated temperature (e.g. 1050° C. for about 1.5 hours). A layer of low-stress silicon nitride 28 (e.g. about 800 nanometers thick) can then be deposited over the thermal oxide layer 26 using low-pressure chemical vapor deposition (LPCVD) at about 850° C. The thermal oxide and silicon nitride layers 26 and 28 provide electrical isolation from the substrate 12 for a subsequently-deposited first polysilicon layer 30 (termed Poly-0). One or more vias can be photolithographically defined and etched through the thermal oxide and silicon nitride layers 26 and 28 so that electrical connections between the Poly-0 layer and the substrate 12 can be formed.

Figure 3B:
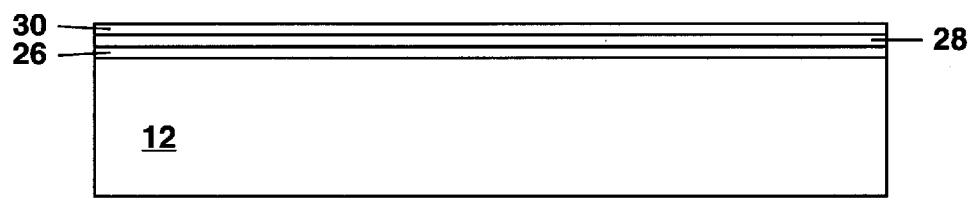

In FIG. 3b, the Poly-0 layer 30, which can be about 300 nanometers thick, is deposited by LPCVD at about 580° C. to blanket the substrate 12 and the thermal oxide and silicon nitride layers, 26 and 28. Phosphorous doping can be used to make the Poly-0 layer and other polysilicon layers electrically conductive as needed to power a MEM actuator which can be formed on the substrate 12 proximate to the compliant structure 10. The Poly-0 layer 30 can be patterned as needed by photolithographic definition and etching to form a ground plane underlying the compliant structure 10 and an electrical distribution network to power the MEM actuator. After deposition and patterning, the Poly-0 layer 30 can be annealed at a high temperature (e.g. at about 1100° C. for three hours) to remove any stress therein.

Figure 3C:
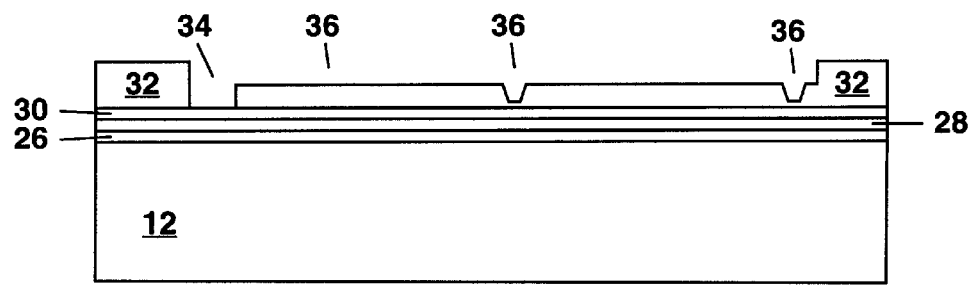

In FIG. 3c, a first layer of a sacrificial material 32 about 2-$\mu$m thick can be blanket deposited to cover the Poly-0 layer 30 and the substrate 12. The first layer of the sacrificial material 32 can comprise silicon dioxide ($SiO_2$) or a silicate glass (e.g. a plasma-enhanced CVD oxide, also termed PECVD oxide; or a silicate glass deposited from the decomposition of tetraethylortho silicate, also termed TEOS, by LPCVD at about 750° C. and densified by a high temperature processing). After deposition, the first layer of the sacrificial material 32 and any succeeding layers of the sacrificial material 32 can be planarized by a chemical-mechanical polishing (CMP) step. This planarizes each succeeding layer of the sacrificial material 32 as needed to provide a uniform topology and to precisely adjust the thickness of the layers. The use of CMP for surface micromachining has been described in detail in U.S. Pat. No. 5,804,084 to Nasby et al, which is incorporated herein by reference.

After the CMP step, a plurality of through-holes 34 can be photolithographically defined and etched (e.g. by reactive ion etching) through the first layer of sacrificial material 32 to the underlying Poly-0 layer 30 at the locations of each support post 24, and at other locations wherein elements of the MEM actuator and load are to be attached to the substrate 12, or electrically connected to the ground plane(s) or to the electrical distribution network. Additionally, one or more recesses 36 can be etched partway through the first layer of the sacrificial material 32 to define the shape of the beams 14, 16, 18 and 20 to be formed and also to define one or more dimples 38 which can be formed below the beams to limit contact of the beams with the underlying Poly-0 layer 30 while allowing the beams to slidingly move across the Poly-0 layer 30 or the substrate 12. These dimples 38 can help to prevent stiction (i.e. adhesion of the compliant structure 10 to the substrate 12).

Figure 3D:
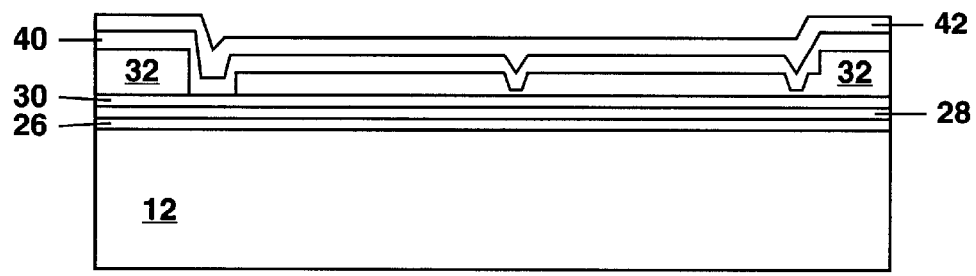

In FIG. 3d, a second layer of polysilicon 40 (termed herein as Poly-1) about 1-$\mu$m thick and a third layer of polysilicon 42 (termed herein as Poly-2) are blanket deposited over the first layer of the sacrificial material 32 to fill in each through-hole 34 and recess 36 therein and begin to build up the compliant structure 10. As shown in FIG. 3d, an upper surface of each of the Poly-1 and Poly-2 layers, 40 and 42, can become non-planar due to draping of the deposited polysilicon into each through-hole 34 and recess 36, thereby degrading the surface topography.

Figure 3E:
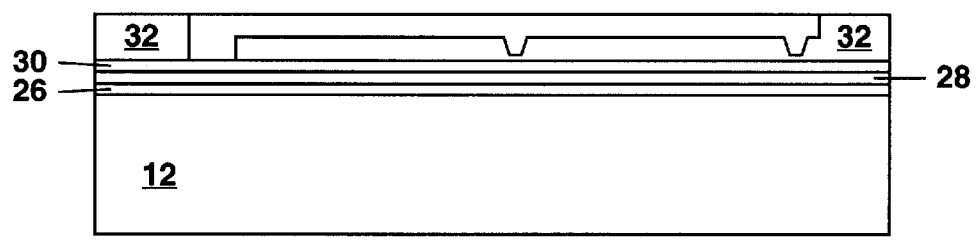

In FIG. 3e, a CMP step can be performed to planarize the Poly-1 and Poly-2 layers, 40 and 42, thereby providing a planar surface. This CMP step can also be used to remove any of the Poly-1 and Poly-2 layers, 40 and 42, not used for forming the compliant structure 10 and other elements of one or more MEM devices being formed on the substrate 12 (e.g. various elements of the MEM actuator and the load which are not shown in FIGS. 3a–3j).

The formation of MEM actuators such as electrostatic comb actuators, capacitive-plate electrostatic actuators and thermal actuators is not described in great detail with reference to FIGS. 3a–3j since the fabrication of these types of MEM actuators is well-known to those skilled in the art. The present invention is particularly applicable for use with a compact electrostatic comb actuator as disclosed in U.S. patent Ser. No. 09/340,994 which is incorporated herein by reference.

The Poly-1 and Poly-2 layers, 40 and 42, and all subsequently-deposited polysilicon layers can be deposited by LPCVD at about 580° C. After the Poly-1 and Poly-2 layers, 40 and 42, have been patterned, an annealing step can be performed as described previously for the Poly-0 layer 30 to remove any residual stress from these layers. A separate annealing step can be performed after deposition and patterning of each subsequent polysilicon layer described hereinafter.

Figure 3F:
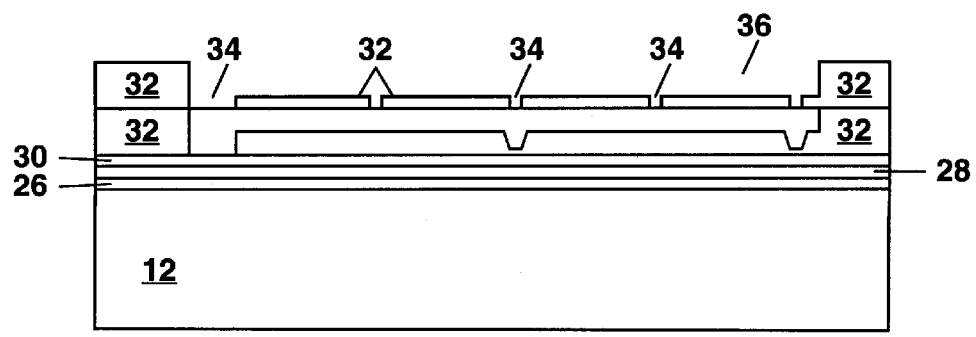

In FIG. 3f, a second layer of the sacrificial material 32 can be blanket deposited over the Poly-1 and Poly-2 layers, 40 and 42, and planarized by CMP to adjust the layer thickness and planarity as needed. The second layer of the sacrificial material 32 can be about 2 $\mu$m thick. In FIG. 3f, the second layer of the sacrificial material 32 is patterned by etching to form a plurality of through-holes 34 at the location of the support posts 24, and at locations wherein pins 44 are to be formed to interconnect different polysilicon layers forming the flexible beam 14. The recess 36 can be enlarged about the location each pin 44 so that a fillet of polysilicon can be formed thereabout to eliminate potential stress concentration at the locations of the pins 44. For a typical flexible beam width of 1–2 $\mu$m, the fillet of polysilicon about each pin 44 can be sized to be about twice the width of the remainder of the flexible beam 14 (i.e. about 2–4 $\mu$m diameter).

Although not shown in FIG. 3f, the locations of a plurality of pins 44 are also defined in the second layer of the sacrificial material 32 at predetermined locations for the other beams 16, 18 and 20 since these other beams are also preferably formed from the same deposited polysilicon layers. The pins 44 can further be used to interconnect the various beams 14, 16, 18 and 20 (see FIG. 5). The width of the beams 16, 18 and 20 does not need to be equal to the width of the flexible beams 14. Fillets of polysilicon can be formed about each pin 44 connecting different layers of a particular beam 14, 16, 18 or 20; or between a pin 44 connecting different beams. Such fillets can be sized, for example, to be about twice the width of the remainder of the beam(s) on which the fillets are formed when a minimum feature size is about 1 $\mu$m.

In FIG. 3f, additional recesses 36 can be formed to define a second layer of each support post 24 and each beam 14, 16, 18 and 20 being built up. Finally, the second layer of the sacrificial material 32 can also be patterned to define features to be formed during the build-up of a MEM actuator and a load (e.g. a driven gear or stage) which are also generally fabricated on the same substrate 12.

Figure 3G:
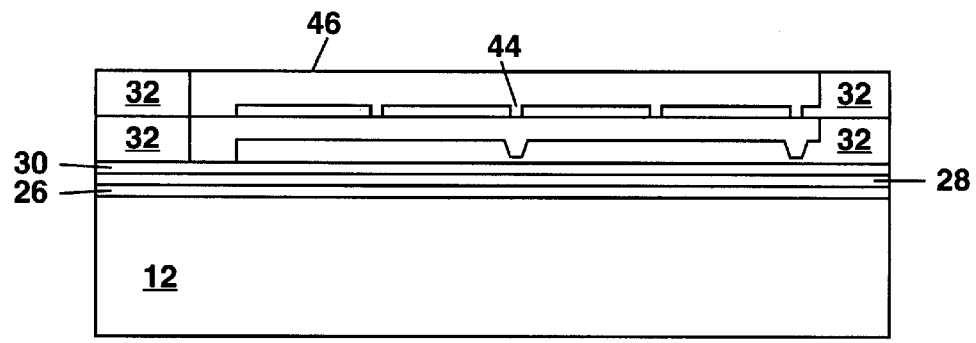

In FIG. 3g, a fourth layer of polysilicon 46 (termed herein as Poly-3) is blanket deposited over the substrate 12 to fill in the mold formed by the patterned second layer of the sacrificial material 32. The Poly-3 layer 46 can be, for example, 2.25-$\mu$m thick. A remaining portion of the Poly-3 layer 46 extending upward beyond the second layer of the sacrificial material 32 and not used for forming the compliant structure 10 or other elements of MEM devices being formed on the substrate 12 can be removed by using either CMP, or by masking and etching.

Figure 3H:
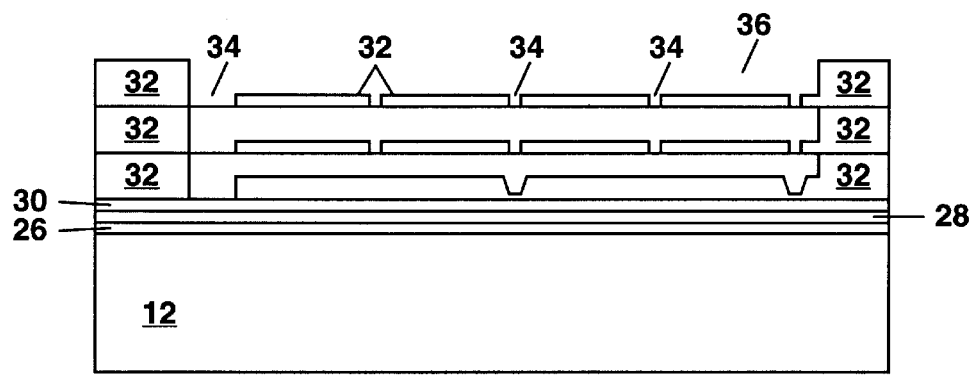

In FIG. 3h, a third layer of the sacrificial material 32 is blanket deposited over the substrate 12 to a layer thickness of about 2 $\mu$m. The third layer of the sacrificial material 32 is then patterned to define a trench or an elongate recess 36 at the location of each beam 14, 16, 18 and 20 being formed and also to define a plurality of through-holes 34 at the locations wherein pins 44 are to be formed.

Figure 3I:
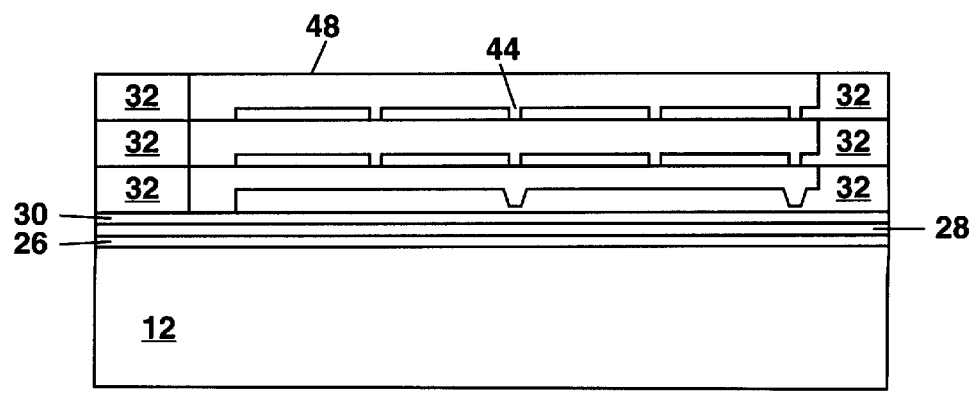

In FIG. 3i, a fifth layer of polysilicon 48 (termed herein as Poly-4) is blanket deposited over the substrate 12 filling in the mold formed by the patterned third layer of the sacrificial material 32 and forming a third layer of each of the beams 14, 16, 18 and 20. The use of multiple layers of polysilicon to form each of the beams 14, 16, 18 and 20 is preferred since it provides an increased stiffness in the vertical direction as compared to the stiffness across the width of the beams. This strengthens the beams 14, 16, 18 and 20 and helps to prevent any sagging of the beams. Additionally, this use of multiple layers of deposited and patterned polysilicon to form the flexible beams 14 allows these beams to be compliant in a lateral direction of movement while having a much reduced compliance in the vertical direction (i.e. in a direction normal to the upper surface of the substrate 12).

Figure 3J:
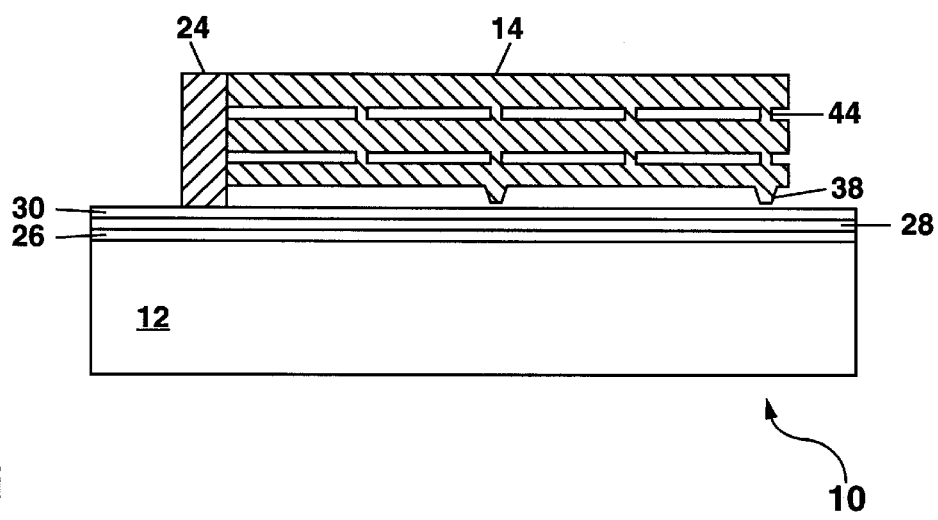

The compliant structure 10 and other MEM devices formed on the substrate 12 can be released for operation by etching away the various layers of the sacrificial material using a selective etchant comprising hydrofluoric acid (HF) that does not chemically attack the polysilicon layers. This can be done over a period of several hours. The completed compliant structure 10 after removal of the sacrificial layers is shown in FIG. 3j.

In other embodiments of the present invention, silicon nitride layers can be substituted for one or more of the polysilicon layers described above to form the compliant structure 10. The silicon nitride can be, for example, a low-stress silicon nitride deposited by plasma-enhanced chemical vapor deposition (PECVD) at about 600° C. or less so that the annealing steps previously described for the various structural polysilicon layers (i.e. Poly-1, Poly-2, Poly-3 and Poly-4) can generally be omitted. The silicon nitride has a slightly lower etch selectivity than polysilicon, but an HF-based selective release etchant is still preferred for fabricating a compliant structure 10 having one or more layers in which the beams 14, 16, 18 and 20 formed of silicon nitride. An advantage of using silicon nitride in forming part or all of the compliant structure 10 is that the silicon nitride is electrically insulating and thus can insulate the compliant structure 10, at least in part, from other electrically-conductive elements (e.g. one or more MEM actuators) to which the compliant structure 10 is connected.

Figure 4:
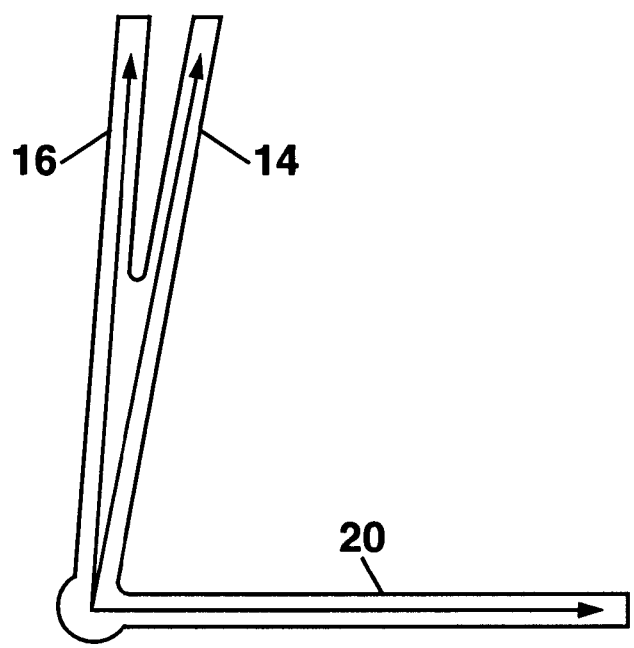
FIG. 4 shows schematically a plan view of a portion of a compliant structure to illustrate photolithographic limitations in forming a sharp intersection between a pair of beams intersecting at a shallow angle.

In the example of FIG. 2, various means can be used to interconnect the flexible beams to the cross-beams 16, the input beam 18 and the output beam 20. For example, two or three intersecting beams can be formed as shown in FIG. 2, with the beams being directly connected together at their ends in each layer of polysilicon used to form the beams. However, due to the finite photolithographic resolution with which the features of the beams 14, 16, 18 and 20 can be defined, a direct connection of adjoining beams can be problematic especially when the beams intersect at a shallow angle. This can lead to a merging of the beams at some distance from a desired intersection point, and also a stiffening of the beams near the intersection point as shown schematically in FIG. 4 which has been drawn from an actual photograph of a partially-fabricated device 10. In FIG. 4, the thin lines with arrows are drawn to indicate an ideal intersection of the various beams, with the beams all joined together at a precise point. For some types of applications of the compliant structure 10, the as-fabricated intersection shown in FIG. 4 may be acceptable. However, for other applications of the compliant structure 10 of the present invention, a more precise intersection may be required.

Figure 5:
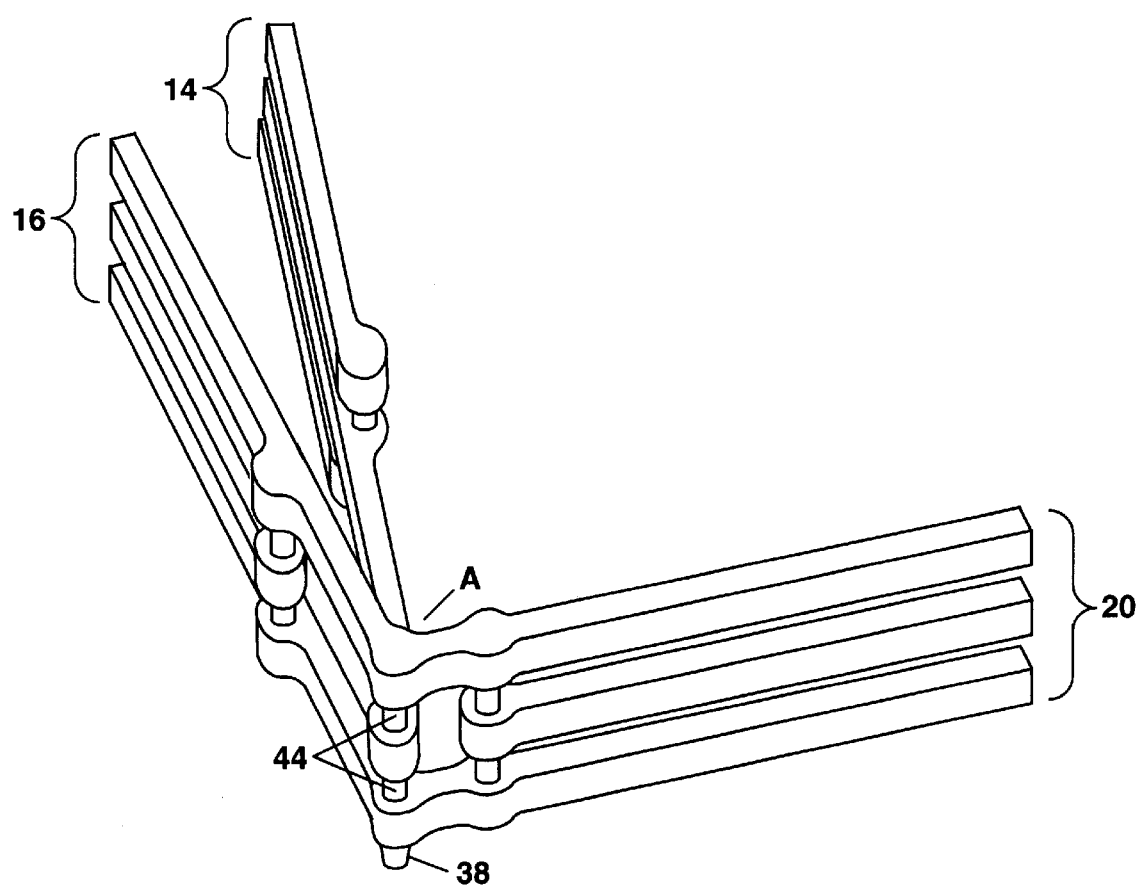
FIG. 5 schematically illustrates in perspective view a method for overcoming the photolithographic limitations illustrated in FIG. 4 to permit the fabrication of a sharp intersection between a pair of beams intersecting at a shallow angle.

To form a more precise intersection of the various of the beams 14, 16, 18 and 20, different pairs of the beams 14, 16, 18 and 20 can be interconnected in different of the polysilicon layers. This is schematically illustrated in the perspective view of FIG. 5 which shows portions of the output beam 20 and the flexible beam 14 and cross-beam 16 which are connected to the output beam 20 at an intersection labelled "A" (this intersection is also indicated in FIG. 2 by the label "A"). The intersection of the beams 14 and 16 occurs at a shallow angle so that it would be difficult due to photolithographic limitations to fabricate a sharp intersection of these beams if they were to interconnect in each polysilicon layer. However, by fabricating the moveable end of flexible beam 14 in a single polysilicon layer and attaching this layer to the beams 16 and 20 through a pair of pins 44, a sharp intersection can be formed. The portion of the beam 14 formed in the single polysilicon layer can optionally be made wider than the remainder of the beam 14 to provide a stiffness or compliance that is about the same as the remainder of the beam 14. In FIG. 5, each pin 44 is rigidly attached to each adjoining pair of polysilicon layers so that the intersection "A" does not form a pivot joint. In FIG. 5, an optional dimple 38 is also shown fabricated beneath the intersection of the beams 16 and 20.

Figure 6:
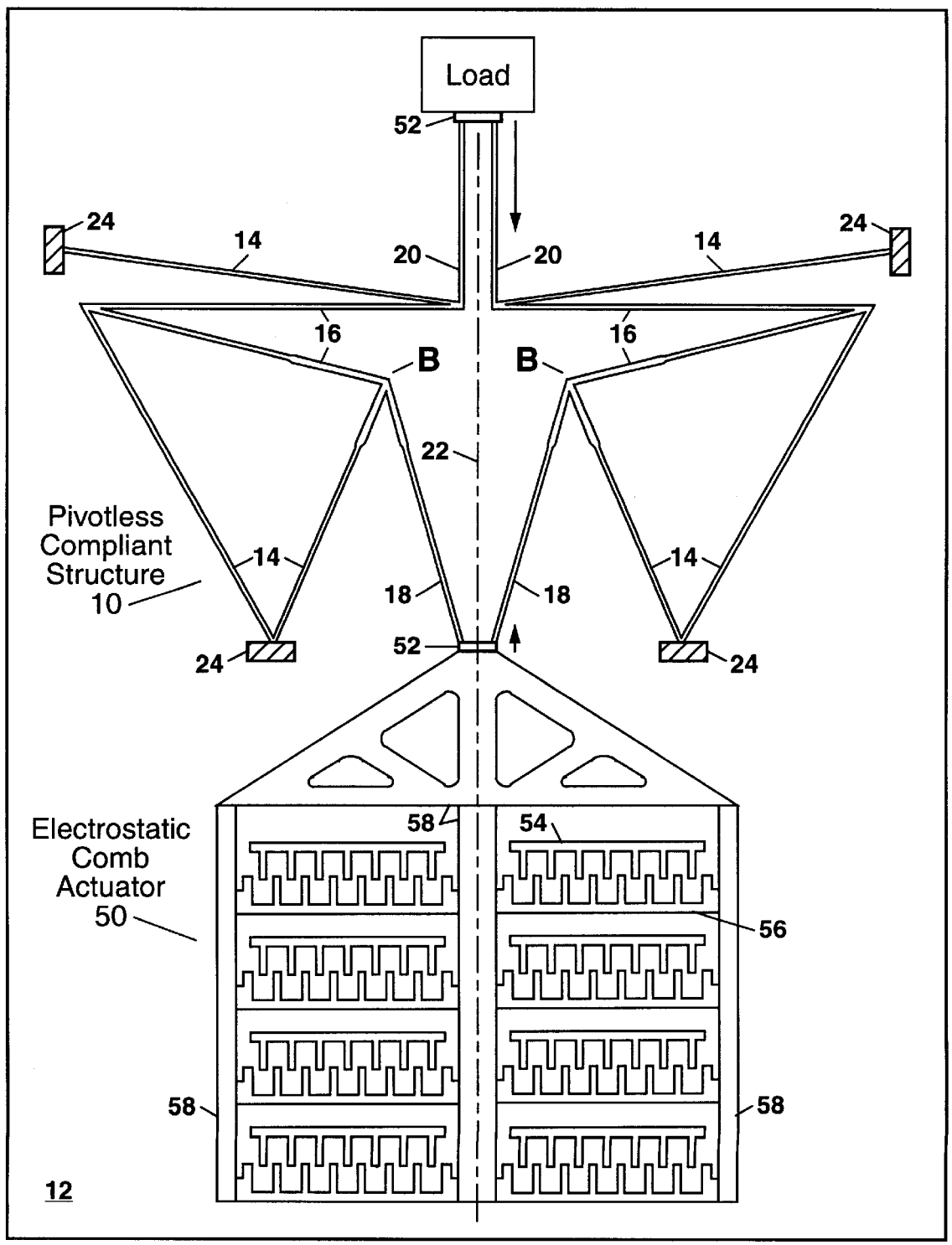
FIG. 6 shows schematically a plan view of a second example of the present invention in the form of a pivotless compliant structure combined with a short-stroke electrostatic comb actuator to generate an increased output displacement.

FIG. 6 shows a second example of the compliant structure 10 of the present invention formed on a substrate 12 proximate to an electrostatic comb actuator 50, thereby forming a MEM apparatus 100 having an increased range of displacement for delivery to a load (e.g. for driving a gear or stage) as compared with the range of displacement provided solely by the actuator 50. The compliant structure 10 in the example of FIG. 6 can be formed from a pair of the devices 10 similar to those in FIG. 2, but oppositely oriented (i.e. as a mirror image) so that their input beams 18 and output beams 20 can be joined together by cross-members 52. This provides a geometric advantage of 12:1 so that the output beams 20 move by twelve times a displacement distance provided to the input beams 18. The cross-members can be formed in the same polysilicon layers (e.g. Poly-1, Poly-2, Poly-3, Poly-4 and Poly-5) which are used to form the compliant structure 10 as described previously with reference to FIGS. 3a–3j.

In the example of FIG. 6, the electrostatic comb actuator 50 can be fabricated on the substrate 12 using the same surface micromachining process steps used to fabricate the compliant structure 10. The electrostatic comb actuator 50 comprises a plurality of stationary combs 54, with each stationary comb 54 having a mating moveable comb 56. The stationary combs 54 are attached to the substrate 12, while the moveable combs 56 are attached to a framework 58 suspended for motion in the direction shown by the small arrow in FIG. 6 when an actuation voltage is provided between the stationary combs 54 and the moveable combs 56. The framework 58 thus forms a moveable output arm of the actuator 50. A plurality of folded restoring springs 60 (not shown in FIG. 6) underlie the framework 58 and the moveable combs 56 to restore these elements to a rest position when the actuation voltage is removed. The application of a periodic voltage (e.g. a square-wave or a triangular-wave voltage) to the electrostatic comb actuator 50 results in cyclic motion of the framework 58 over a range of displacement (indicated by the short arrow in FIG. 6) of typically less than or equal to 5 $\mu$m.

In the example of FIG. 6, the compliant structure 10 is fabricated attached to the electrostatic comb actuator 50. In the position shown in FIG. 6, the compliant structure 10 performs a displacement multiplying function receiving a short input displacement stroke from the actuator 50 (indicated by the short arrow in FIG. 6) and providing a multiplied output displacement which can be, for example, 5–60 times larger than the input displacement as indicated by the long arrow in FIG. 6. The reversal of the direction of the long arrow in FIG. 6 with respect to the short arrow indicates that the output of the compliant structure 10 in the example of FIG. 6 operates 180° out-of-phase with respect to its input when the structure 10 is operated below resonance.

Figure 7:
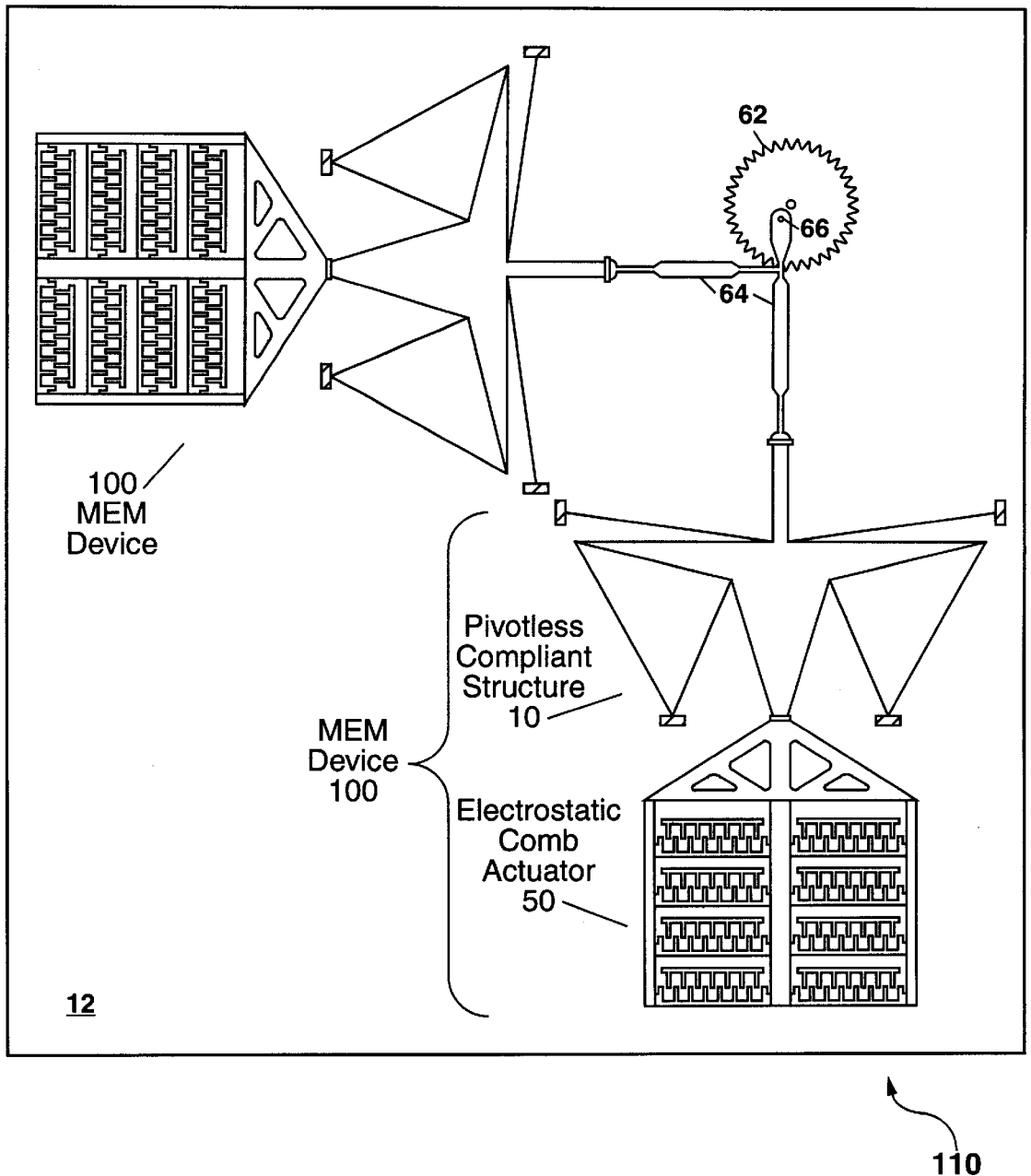
FIG. 7 shows schematically in plan view a microengine formed by a pair of devices as in FIG. 6 that are electrically operated out-of-phase to rotate a gear.

In FIG. 7, a pair of MEM devices 100 can be formed orthogonally on a silicon substrate 12 and electrically driven out-of-phase with respect to each other to drive a gear 62 through a linkage 64 connected to an output side of each compliant structure 10, thereby forming a microengine 110. This can be done using a pair of unidirectional or bidirectional electrostatic comb actuators 50. The linkage 64 is connected to an off-axis pin joint 66 on the gear 62, to rotate the gear 62 in response to a cyclic out-of-phase displacement provided to the linkage 64 by the combination of the electrostatic comb actuator 50 and the pivotless compliant structure 10. This requires an output displacement at the linkage 64 of, for example, 34 $\mu$m which is generated by compliant structure 10 from a much smaller input displacement (e.g. 2–3 $\mu$m) from the actuator 50. The gear 62 can be used in turn to drive a gear train, a rack or any other type of gear-driven micromachine known to the art. Details of a similar microengine formed without a compliant structure 10 can be found in U.S. Pat. No. 5,631,514 to Garcia et al, which is incorporated herein by reference.

Figure 8:
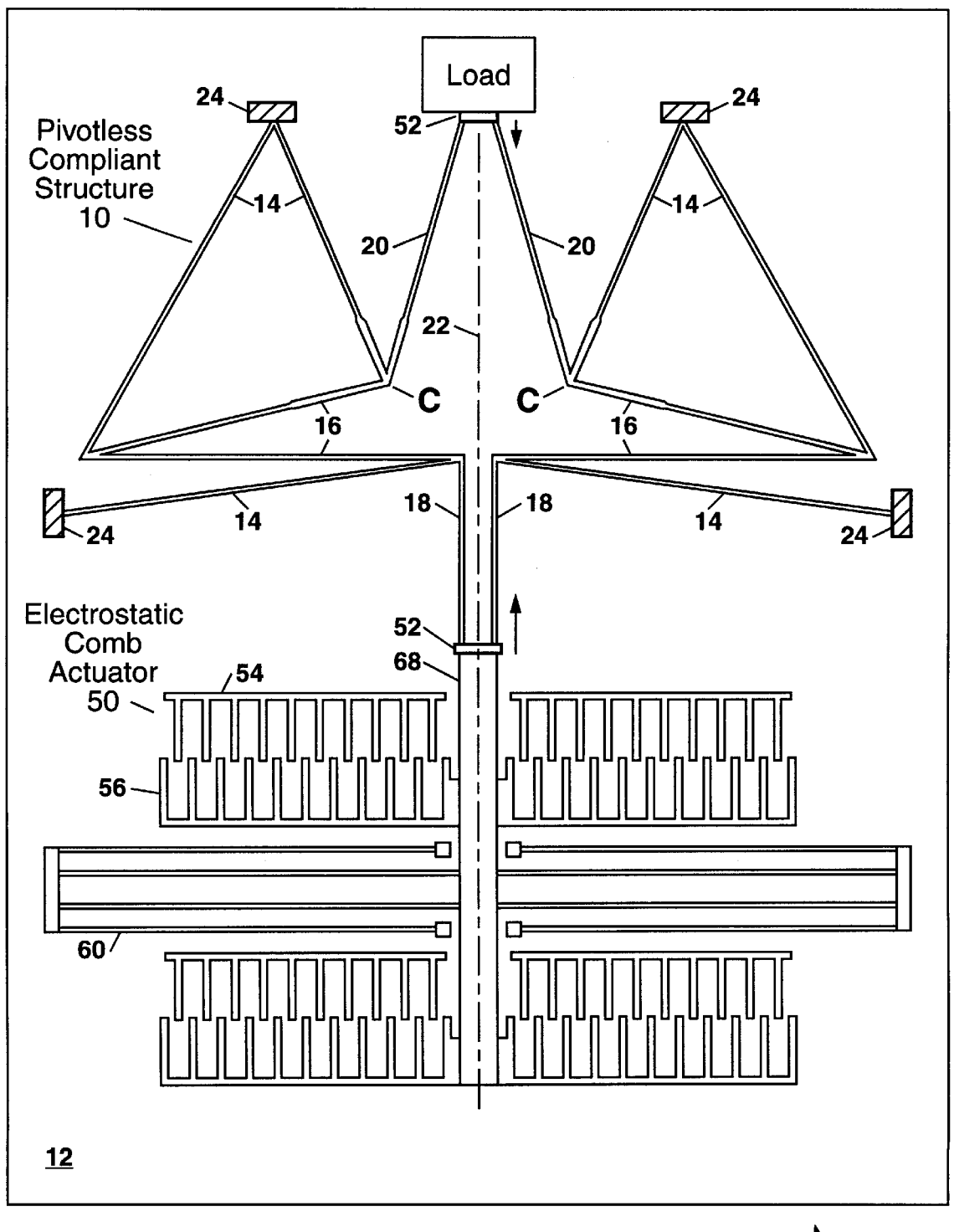
FIG. 8 shows schematically a plan view of a third example of the present invention in the form of a pivotless compliant structure operated in a reverse sense and combined with a conventional electrostatic comb actuator to generate an increased output force.

Since the compliant structure 10 of FIGS. 6 and 7 acts to provide an increased output displacement with respect to the input displacement, the output force must be correspondingly reduced with respect to the input force to conserve energy. In other embodiments of the present invention, the compliant structure 10 in FIG. 6 and 7 can be fabricated in a reversed sense as shown in a third example of the present invention in FIG. 8. Here, the compliant structure 10 is used in combination with a conventionally-formed electrostatic comb actuator 50 having an outboard folded restoring spring 60 and a moveable output arm 68 on which a plurality of moveable electrostatic combs 56 are attached. Such conventionally-formed electrostatic comb actuators 50 can produce a relatively large stroke (e.g. 10–30$\mu$m), but their usefulness has heretofore been limited for many types of applications since they produce a relatively small output force of typically a few tens of microNewtons ($\mu$N). By forming a MEM apparatus 120 as shown in FIG. 8 in which the conventionally-formed electrostatic comb actuator 50 is operated in combination with a compliant structure 10 to increase its output force, a wider range of applications becomes possible. In increasing the output force of the compliant structure 10 relative to the input force from the conventionally-formed electrostatic comb actuator 50, the output displacement is correspondingly reduced with respect to the input displacement. This is indicated by the relative length of the arrows in FIG. 8. The structure 10 shown in FIG. 8 provides a mechanical advantage of about 12:1.

In the examples of the present invention in FIGS. 6 and 8, a portion of the beams 14, 16, 18 and 20 can be stiffened at points indicated by the labels "B" and "C" where the forces transmitted by the beams are increased relative to the forces at other of the intersections of the beams. The stiffening at points "B" and "C" can be produced, for example, by widening the beams at these points relative to the remainder of the beams. In the case of FIG. 6, a back force produced by the load is increased by the 12:1 mechanical advantage produced by the compliant structure 10 in the reverse direction so that this back force is largest at the point "B". In the case of FIG. 8, the forward force produced by the actuator 50 is similarly increased by the 12:1 mechanical advantage of the compliant structure so that it is largest at the point "C".

Other types of compliant structures 10 can be formed according to the present invention for use with electrostatic comb actuators, or for use with other types of MEM actuators such as capacitive-plate electrostatic actuators and thermal actuators.

Figure 9:
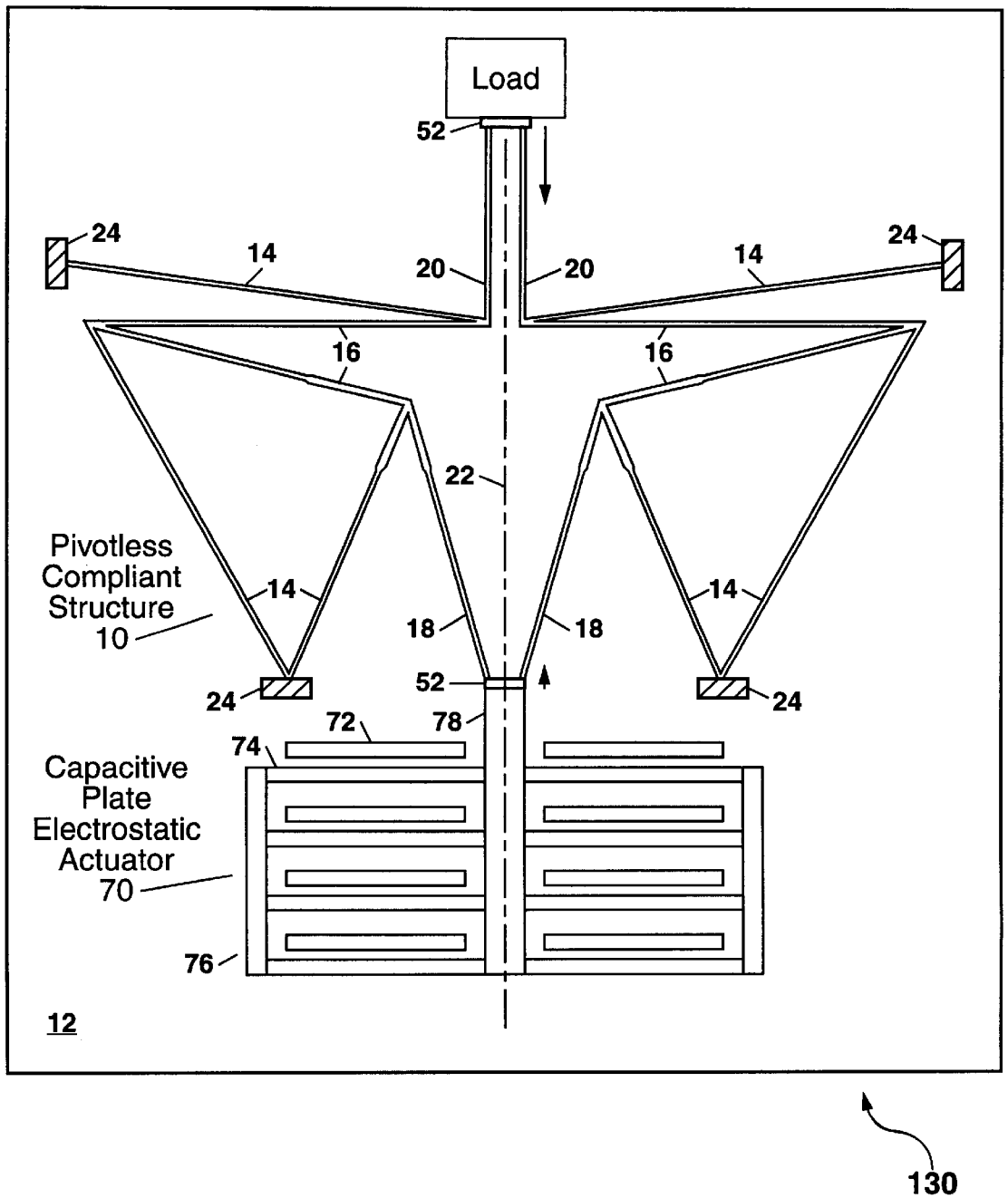
FIG. 9 shows schematically a plan view of a fourth example of the present invention in the form of a pivotless compliant structure combined with a capacitive-plate electrostatic actuator to provide an increased output displacement.

FIG. 9 shows a fourth example of the present invention with a pivotless compliant structure 10 being used in combination with a capacitive-plate electrostatic actuator 70 to form a MEM apparatus 130. The capacitive-plate electrostatic actuator 70 generally provides a relatively large actuation force compared with an electrostatic comb actuator, but over a smaller displacement range (e.g. 1–2 $\mu$m). In a capacitive-plate electrostatic actuator, the electrostatic force produced varies inversely as the distance between a pair of capacitor plates; whereas in an electrostatic comb actuator, the electrostatic force is relatively independent of motion.

In FIG. 9, the capacitive-plate electrostatic actuator 70 comprises a plurality of stationary capacitor plates 72 and a plurality of moveable capacitor plates 74, with the moveable plates 74 being held suspended above the substrate 12 in a frame 76 having a central beam 78 connected to the cross-members 52. The application of a voltage between the stationary plates 72 and the moveable plates 74 which are separated by a gap generates an electrostatic force of attraction which depends on the area of the plates 72 and 74 and on the gap between the plates 72 and 74. This electrostatic force urges the plates 74 in the direction of the stationary plates 72 (i.e. in the direction indicated by the short arrow in FIG. 9), with the electrostatic force increasing as the gap narrows. With the central beam 78 connected to an input side of the compliant structure 10, a range of displacement provided by the actuator 70 can be multiplied to provide an increased displacement at an output side of the structure 10 (indicated by the larger arrow in FIG. 9). One or more stops (not shown) can be provided to limit the range of displacement of the actuator 70 and thereby prevent any physical contact between the stationary and moveable plates, 72 and 74, which could otherwise possibly result in an electrical short circuit. The moveable capacitor plates 74 and support frame 76 are suspended above the substrate 12 by a plurality of restoring springs (not shown) located outside or preferably underneath the frame 76.

Figure 10:
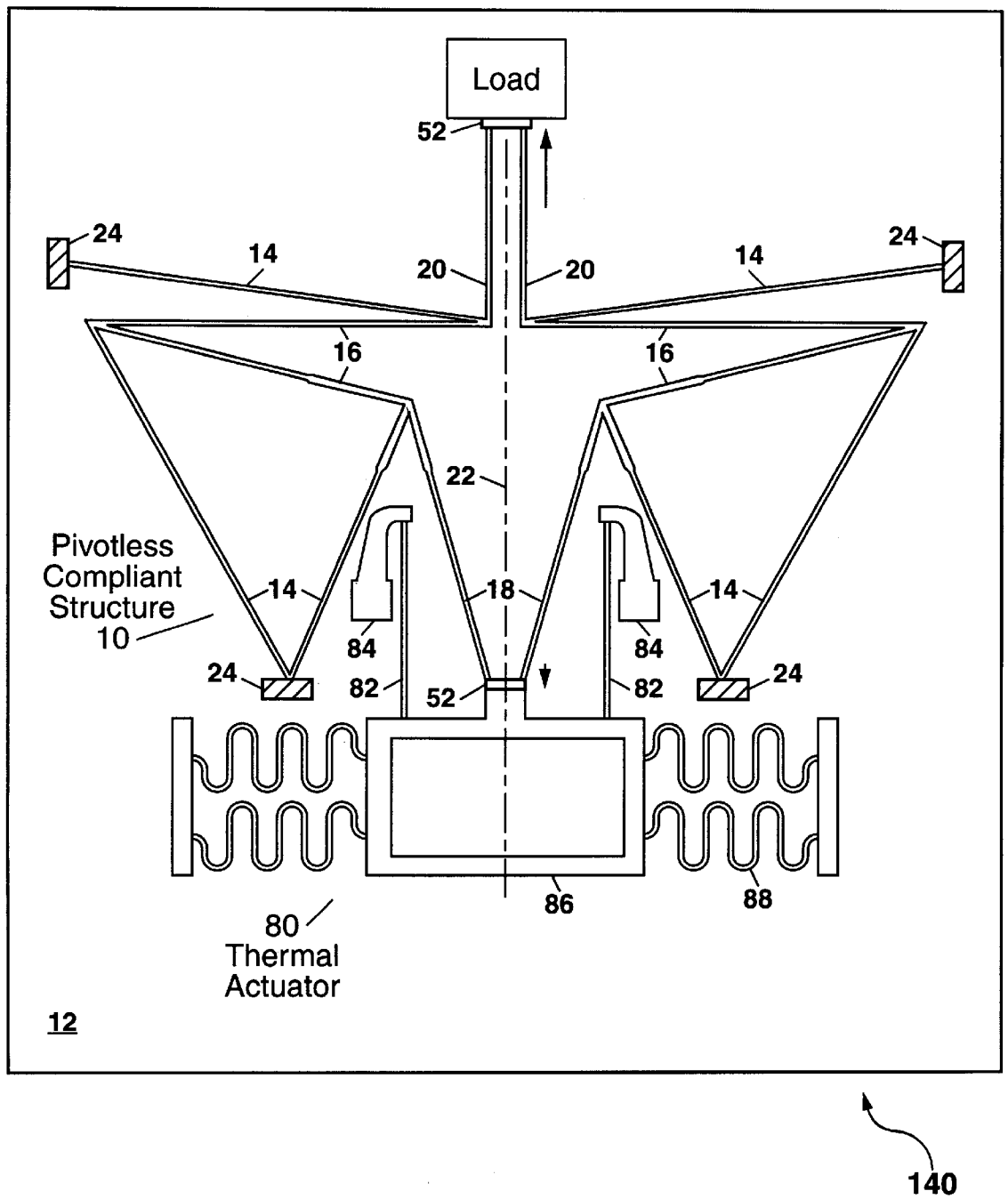
FIG. 10 shows schematically a plan view of a fifth example of the present invention in the form of a pivotless compliant structure combined with a thermal actuator to provide an increased output displacement.

FIG. 10 shows a fifth example of the present invention with a pivotless compliant structure 10 being used in combination with a thermal actuator 80 to form a MEM apparatus 140. The thermal actuator 80 comprises a plurality of suspended hot arms 82 which thermally expand in response to heating by an applied electrical current (e.g. 5 mA). The use of a thermal actuator 80 is advantageous since this allows operation with a relatively low voltage (e.g. 5–10 Volts) as compared to an electrostatic actuator.

In FIG. 10, the electrical current flows from a cold arm 84 to which one end of each hot arm 82 and therefrom through the hot arm 82 to a suspended shuttle 86 to which the other end of each hot arm 82 is attached. The shuttle 86, which can be in the form of a hollow frame as shown in FIG. 10, is suspended for movement by a plurality of springs 88 which are attached to the substrate 12, with the electrical current also flowing from the shuttle 86 through the springs 88 to the substrate 12, or to an electrical distribution network.

Electrical heating of the hot arms 82 to about 400° C. can produce a thermal expansion in a 250-$\mu$m-long polysilicon hot arm that is about one-quarter of a micron. As the hot arms 82 expand, they push against the shuttle 86 causing the shuttle 86 to move. This, in turn, moves the input beams 18 to which the shuttle 86 is connected. Upon removal of the electrical current from each hot arm 82, the hot arms 82 cool and shrink back to their initial length, thereby forcing and shuttle 86 back to its initial position.

A cyclic heating and cooling of the thermal actuator can be used to produce a cyclic motion of the output beams 20 of the compliant structure 20. This can be used, for example, to generate an output displacement of about 10 $\mu$m to drive a ratchet pawl that can engage and rotate a gear, a moveable stage or a rack (see FIG. 12). A range of displacement produced by the thermal actuator 80 can be increased at the output of the compliant structure 10 by a factor of, for example, 5–60. If needed, additional flexible beams 14 and cross-beams 16 can be added to the compliant structure 10 in the example of FIG. 10 to further increase the output displacement. Alternately, a plurality of compliant structures 10 can be ganged together in series to get an even larger output displacement.

Those skilled in the art will understand that each of the compliant structures 10 described herein can be operated in one direction to multiply a range of displacement and to correspondingly decrease an applied actuation force; or these same structures 10 can be operated in the opposite direction to multiply an applied actuation force and to provide a decreased range of displacement. Furthermore, those skilled in the art will understand that other arrangements of the compliant structure 10 of the present invention are possible to provide an output displacement that is either in-phase or out-of-phase with respect to an input displacement.

Figure 11:
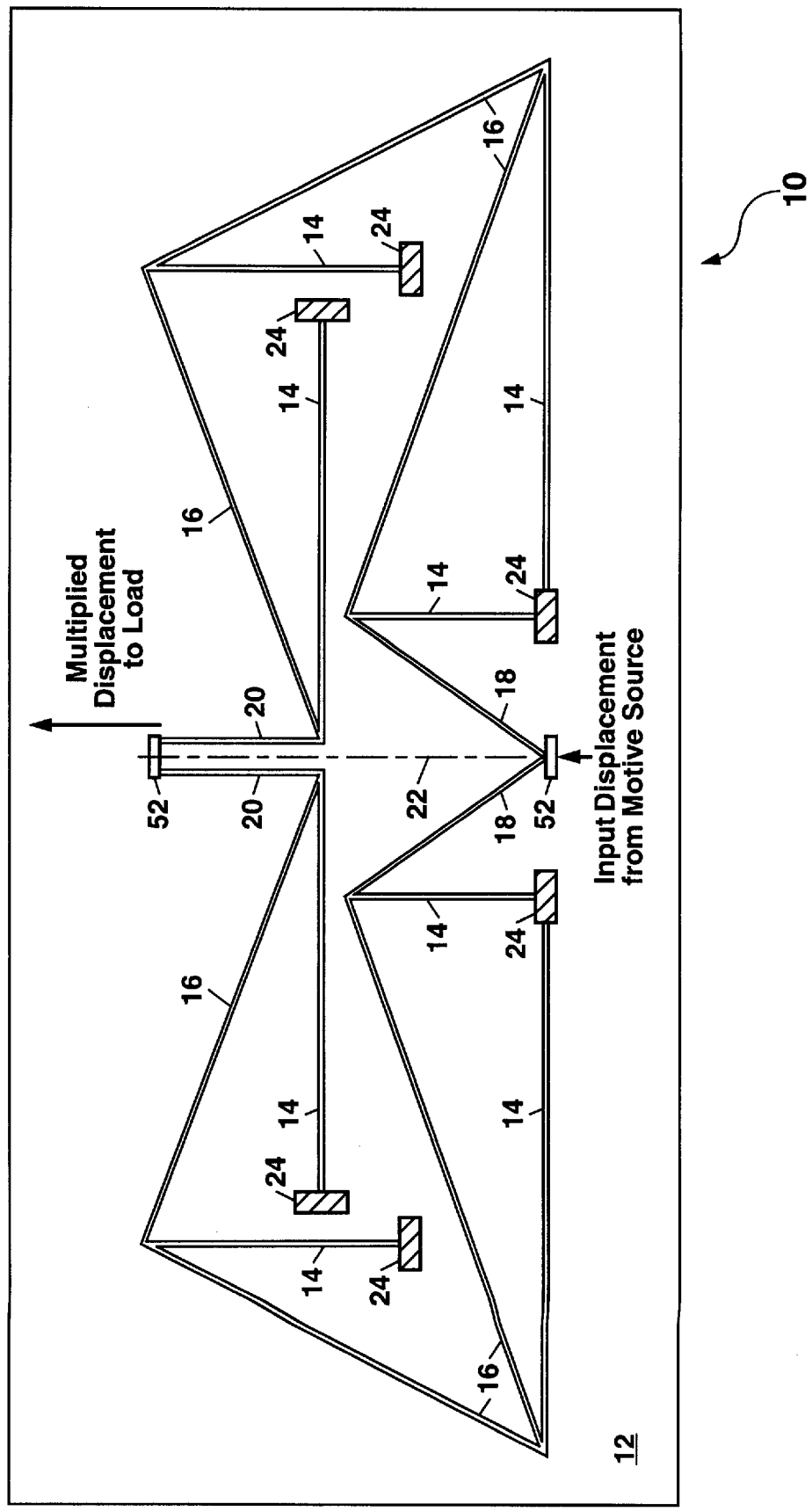
FIG. 11 shows schematically in plan view an alternate arrangement for the pivotless compliant structure of the present invention to generate an output displacement that is in-phase with an input displacement.

An example of a compliant structure 10 for producing an output displacement that is in-phase with respect to an input displacement with about 20 times larger than the input displacement is shown in FIG. 11. The structure 10 in FIG. 11 utilizes four flexible beams 14 interconnected by cross-members 16 to receive an input displacement and force through a pair of input beams 18 and generate therefrom an increased output displacement and a decreased output force at a pair of output beams 20. The output displacement and force are directed in-line and in-phase with the input displacement and force. Each beam 14, 16, 18 and 20 in the example of FIG. 11 can be, for example, about 50–200 $\mu$m long, about 1–2 $\mu$m wide and about 4–7 $\mu$m thick. The structure 10 of FIG. 11 can be fabricated on a silicon substrate 12 as described herebefore with reference to FIGS. 3a–3j.

Figure 12:
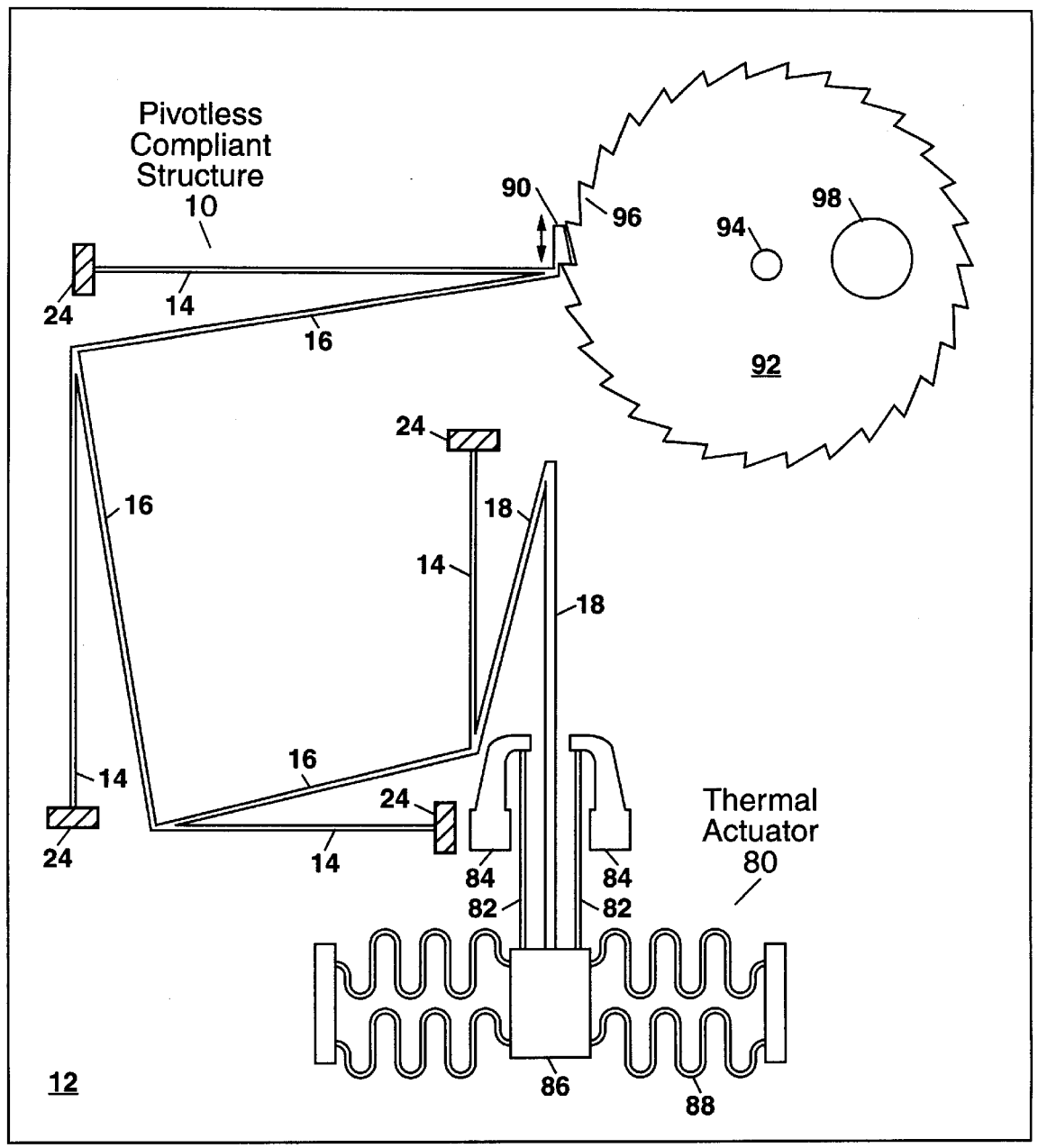
FIG. 12 shows a schematic plan view of yet another arrangement for the pivotless compliant structure of the present invention to form a MEM ratcheting device driven by a thermal actuator.

FIG. 12 shows yet another example of a compliant structure 10 which can be fabricated on a substrate 12 according to the present invention to form a MEM device 150. The compliant structure 10 of FIG. 12 provides an output displacement that is out-of-phase with respect to the input displacement, with the output displacement being about 50–60 times larger than the input displacement. The compliant structure 10 of FIG. 12 can be used, for example, with a thermal actuator 80 to provide a reciprocating output displacement (indicated by the double-headed arrow) of about 10 $\mu$m for use in driving a ratchet pawl 90 to incrementally rotate a stage 92 about a hub 94. In the example of FIG. 12, each hot arm 82 of the thermal actuator 80 is electrically heated and expands thereby moving a folded input beam 18 downward. This downward displacement of the input beam 18 is amplified by the compliant structure 10 thereby moving the ratchet pawl 90 upward by an amount (e.g. 10 $\mu$m) sufficient to engage an adjacent tooth 96 on the stage 92. Cooling of each hot arm 82 by removal of the electrical current (or by using a cyclic electrical current) then results in the hot arm 82 contracting to its original length. This acts on the ratchet pawl 90 to pull the pawl 90 downward, thereby incrementally rotating the stage 92 in a counterclockwise direction. If a gear is provided on the stage 92, the MEM device 150 can be used as a microengine for driving additional MEM devices. Alternately, an aperture 98 can be formed through the stage 92 as shown in FIG. 12 thereby forming a shutter for a light beam (e.g. from a laser or light-emitting diode), with a corresponding aperture preferably formed through the substrate 12. In other embodiments of the present invention, the thermal actuator 80 can be positioned for connection to a linear input beam 18 so that the force generated by the actuator 80 is in-line with the input beam 18.

The matter set forth in the foregoing description and accompanying drawings is offered by way of illustration only and not as a limitation. Other applications and variations of the present invention will become evident to those skilled in the art. For example, any type of MEM actuator (including fluid or pressure diaphragm actuators) can be used in combination with the pivotless compliant structure 10 of the present invention to modify a displacement and force from the MEM actuator. The actual scope of the invention is intended to be defined in the following claims when viewed in their proper perspective based on the prior art.

What is claimed is:

1. A pivotless compliant structure formed on a substrate for receiving an input displacement at one end thereof from a motive source, and generating a multiplied displacement therefrom for provision to a load, the pilotless compliant structure comprising:

(a) a plurality of flexible beams each attached at one end thereof to the substrate, with the other end of each of the flexible beams being moveable;

(b) an input beam connected between the motive source and a first flexible beam;

(c) an output beam connected between the load and a second flexible beam; and (d) a plurality of cross-beams interconnecting the first flexible beam to the second flexible beam, with each of the cross-beams further being connected between the moveable ends of an adjacent pair of the plurality of flexible beams, with each of the flexible beams, input beam, output beam, and cross-beams being formed, at least in part, of polycrystalline silicon or silicon nitride.

2. The structure of claim 1 wherein the substrate comprises silicon.

3. The structure of claim 1 wherein the motive source comprises a microelectromechanical (MEM) actuator selected from the group consisting of electrostatic comb actuators, capacitive-plate electrostatic actuators, and thermal actuators.

4. A pair of pivotless compliant structures as in claim 1 arranged in mirror symmetry about a common axis.

5. A microelectromechanical (MEM) apparatus, comprising:

(a) a MEM actuator providing movement over a first linear displacement range, and further providing a first force of actuation; and (b) a pivotless compliant structure formed, at least in part, of polycrystalline silicon or silicon nitride and operatively connected to the MEM actuator for receiving the movement over the first linear displacement range and the first force of actuation and generating therefrom a second linear displacement range which is different from the first linear displacement range, and a second force of actuation which is different from the first force of actuation.

6. The MEM apparatus of claim 5 wherein the pivotless compliant structure comprises:

(a) a plurality of flexible beams, with each flexible beam having a stationary end and a moveable end;

(b) an input beam connected between the MEM actuator and the moveable end of a first flexible beam of the plurality of flexible beams;

(c) an output beam connected at one end thereof to the moveable end of a second flexible beam of the plurality of flexible beams; and (d) a plurality of cross-beams arranged to interconnect the moveable ends of each of the plurality of flexible beams, thereby operatively connecting the input beam to the output beam.

7. The MEM apparatus of claim 6 wherein each cross-beam is oriented at an angle of less than 90° with respect to each flexible beam to which that cross-beam is connected.

8. The MEM apparatus of claim 6 wherein the input beam and the output beam move substantially in-phase with respect to each other.

9. The MEM apparatus of claim 6 wherein the input beam and the output beam move substantially out-of-phase with respect to each other.

10. The MEM apparatus of claim 5 wherein the second force of actuation is substantially in-line with the first force of actuation.

11. The MEM apparatus of claim 5 wherein the second force of actuation is directed at an angle with respect to the first force of actuation.

12. The MEM apparatus of claim 5 wherein the second linear displacement range is greater than the first linear displacement range, and the second force of actuation is less than the first force of actuation.

13. The MEM apparatus of claim 12 wherein the second linear displacement range is in the range of five to sixty times larger than the first linear displacement range.

14. The MEM apparatus of claim 12 wherein the first linear displacement range is less than or equal to 5 microns.

15. The MEM apparatus of claim 5 wherein the second linear displacement range is less than the first linear displacement range, and the second force of actuation is greater than the first force of actuation.

16. The MEM apparatus of claim 15 wherein the second linear displacement range is in the range of one-fifth to one-sixtieth of the first linear displacement range.

17. The MEM apparatus of claim 5 wherein the MEM actuator and the pivotless compliant structure are formed on a common substrate.

18. The MEM apparatus of claim 17 wherein the stationary end of each flexible beam is attached to the substrate.

19. The MEM apparatus of claim 17 wherein the substrate comprises silicon.

20. The MEM apparatus of claim 5 wherein the MEM actuator comprises an electrostatic comb actuator.

21. The MEM apparatus of claim 5 wherein the MEM actuator comprises a capacitive- plate electrostatic actuator.

22. The MEM apparatus of claim 5 wherein the MEM actuator comprises a thermal actuator.

23. A microelectromechanical (MEM) apparatus, comprising:
(a) a substrate;
(b) a MEM actuator formed on the substrate; and
(c) a pivotless compliant structure formed of polycrystalline silicon or silicon nitride on the substrate proximate to the MEM actuator and operatively connected thereto for multiplying a range of displacement provided by the MEM actuator.

24. The MEM apparatus of claim 23 wherein the substrate comprises silicon.

25. The MEM apparatus of claim 23 wherein the MEM actuator comprises an actuator selected from the group consisting of electrostatic comb actuators, capacitive-plate electrostatic actuators, and thermal actuators.

26. The MEM apparatus of claim 23 wherein the pivotless compliant structure further comprises:
a plurality of flexible beams, with each flexible beam having a stationary end attached to the substrate, and a moveable end; and
a plurality of cross-beams, with each cross-beam interconnecting the moveable ends of an adjacent pair of the plurality of flexible beams.

27. The MEM apparatus of claim 26 wherein each cross-beam is oriented at an angle of less than 90° with respect to each flexible beam to which the cross-beam is connected.

28. The MEM apparatus of claim 23 wherein the range of displacement of the moveable output arm of the MEM actuator is less than or equal to 5 microns.

29. The MEM apparatus of claim 28 wherein the range of displacement of the moveable output arm of the MEM actuator is multiplied by a factor in the range of five to sixty by the pivotless compliant structure.

* * * * *